United States Patent
Tokuno

(10) Patent No.: US 7,936,179 B2
(45) Date of Patent: May 3, 2011

(54) SEMICONDUCTOR INTEGRATED CIRCUIT AND METHOD OF TESTING CIRCUIT

(75) Inventor: Hideyuki Tokuno, Kanagawa (JP)

(73) Assignee: Renesas Electronics Corporation, Kanagawa (JP)

( * ) Notice: Subject to any disclaimer, the term of this patent is extended or adjusted under 35 U.S.C. 154(b) by 0 days.

(21) Appl. No.: 12/847,859

(22) Filed: Jul. 30, 2010

(65) Prior Publication Data

US 2011/0031995 A1 Feb. 10, 2011

(30) Foreign Application Priority Data

Aug. 7, 2009 (JP) ................................. 2009-185028

(51) Int. Cl.
*H03K 19/00* (2006.01)
*G01R 31/02* (2006.01)
(52) U.S. Cl. ......................... 326/16; 326/15; 324/762.02
(58) Field of Classification Search .............. 326/15–16; 324/762.01, 762.02
See application file for complete search history.

(56) References Cited

U.S. PATENT DOCUMENTS

| 6,864,873 | B2 * | 3/2005 | Yamagata et al. | 345/98 |
| 6,879,174 | B2 * | 4/2005 | Uchida | 324/762.02 |
| 7,019,550 | B2 * | 3/2006 | Wehage et al. | 326/16 |

FOREIGN PATENT DOCUMENTS

| JP | 10-213616 A | 8/1998 |
| JP | 11-264855 A | 9/1999 |

* cited by examiner

*Primary Examiner* — James Cho
(74) *Attorney, Agent, or Firm* — Sughrue Mion, PLLC

(57) ABSTRACT

A semiconductor integrated circuit includes: a ladder resistor; a ROM decoder; and a test circuit. The ladder resistor includes a plurality of resistors series-connected to each other and is supplied with a correction voltage at least one of both ends of the series connection and a plurality of connection points in the series connection to generate a plurality of gradation voltages at the plurality of connection points. The ROM decoder selects one of the plurality of gradation voltages generated by the ladder resistor, based on a supplied data signal. The test circuit measures a leakage current in the ROM decoder. The test circuit includes: a plurality of separation units, and a control unit. The plurality of separation units separates the series connection, which is respectively supplied with different power source voltages at both ends, at a certain portion, when the leakage current is measured. The control unit controls separation of the plurality of separation unit corresponding to the data signal.

11 Claims, 20 Drawing Sheets

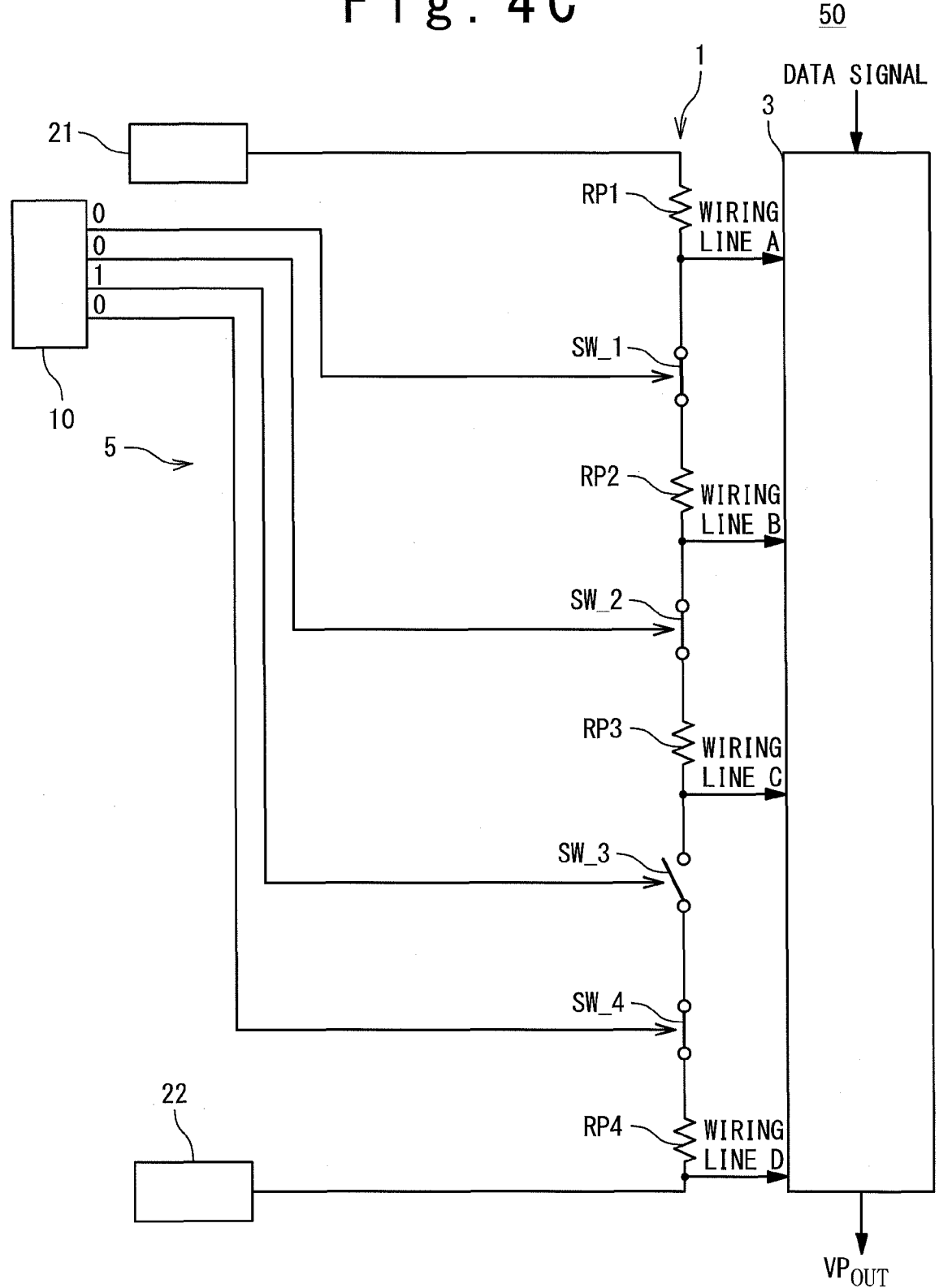

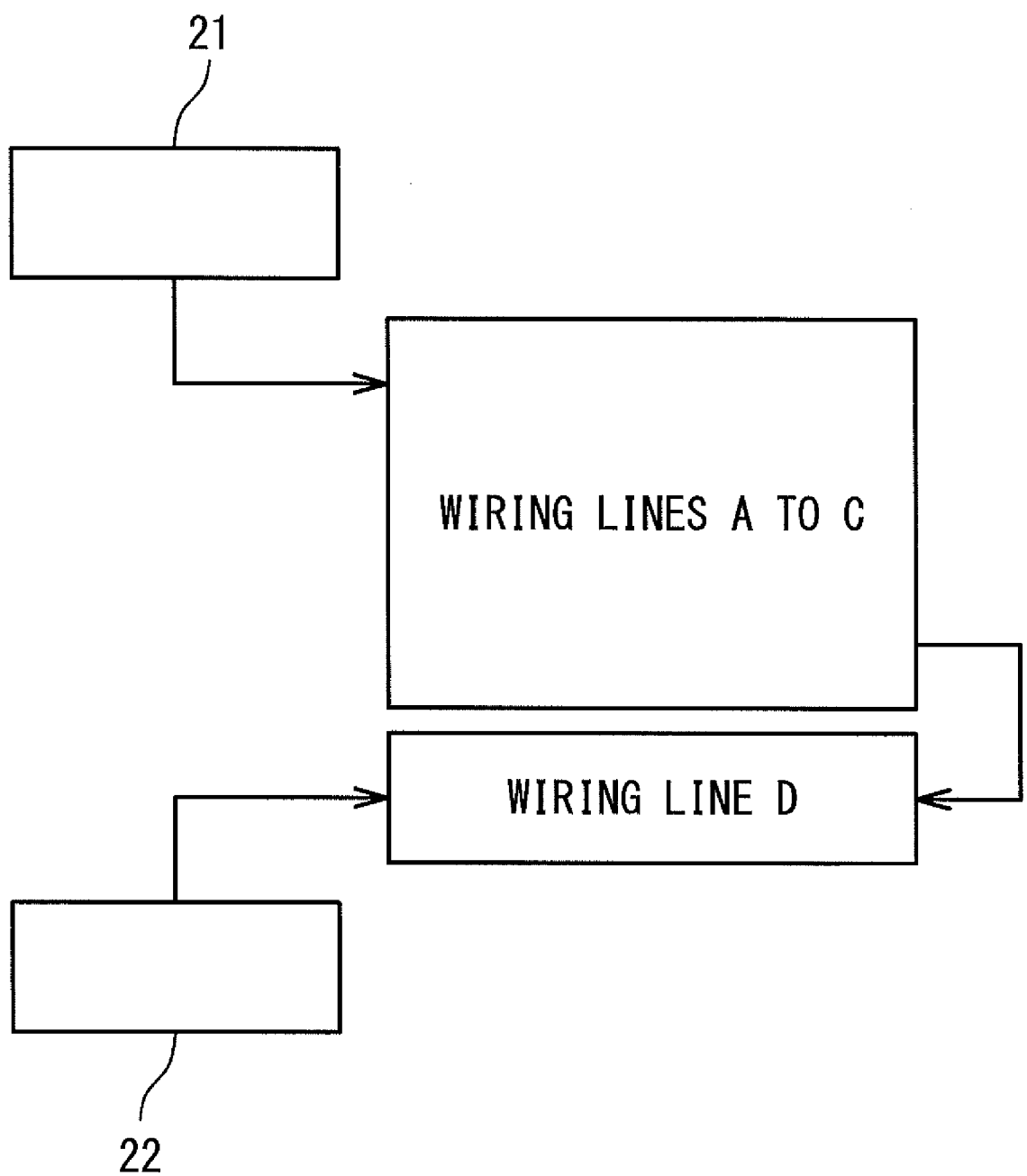

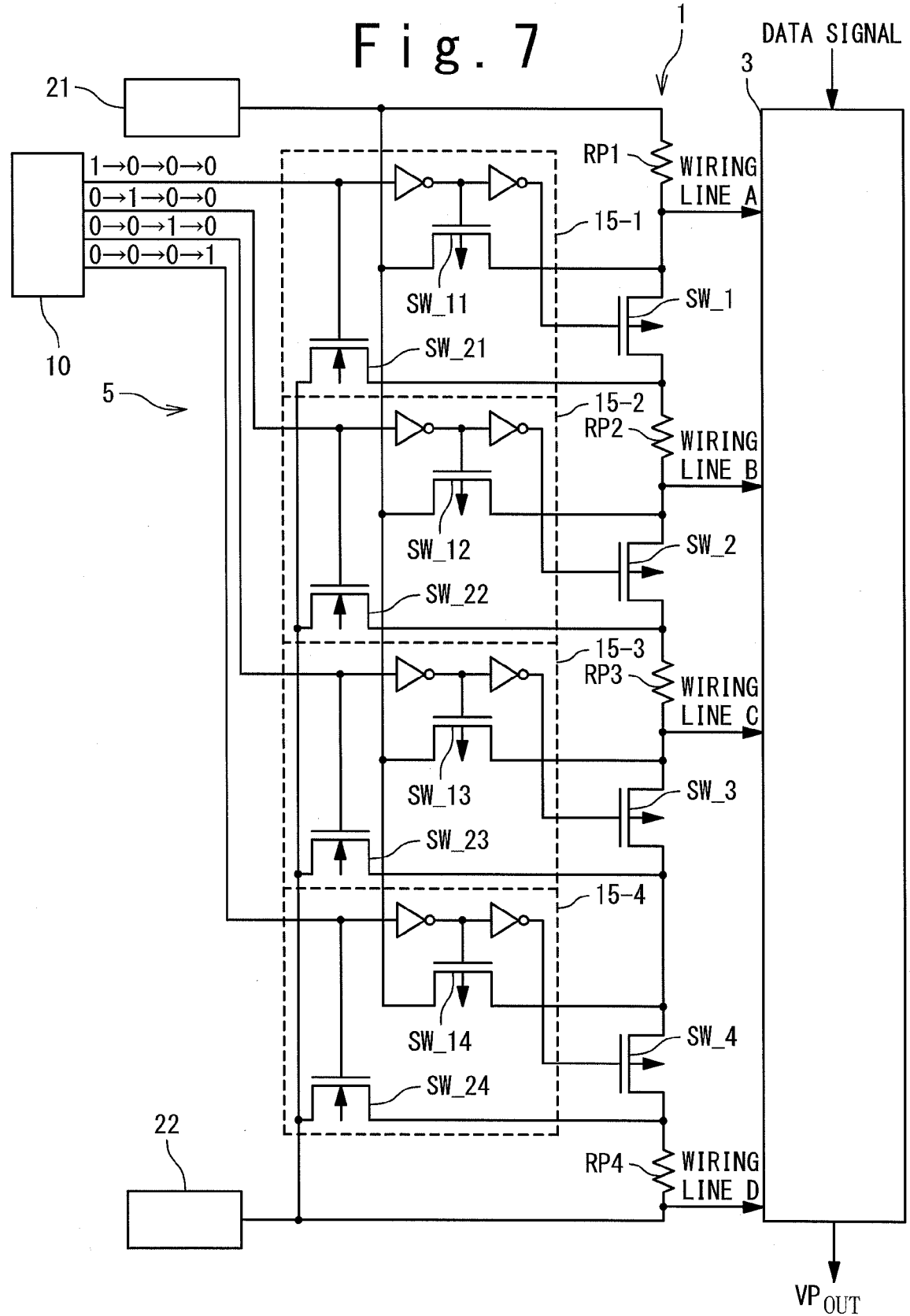

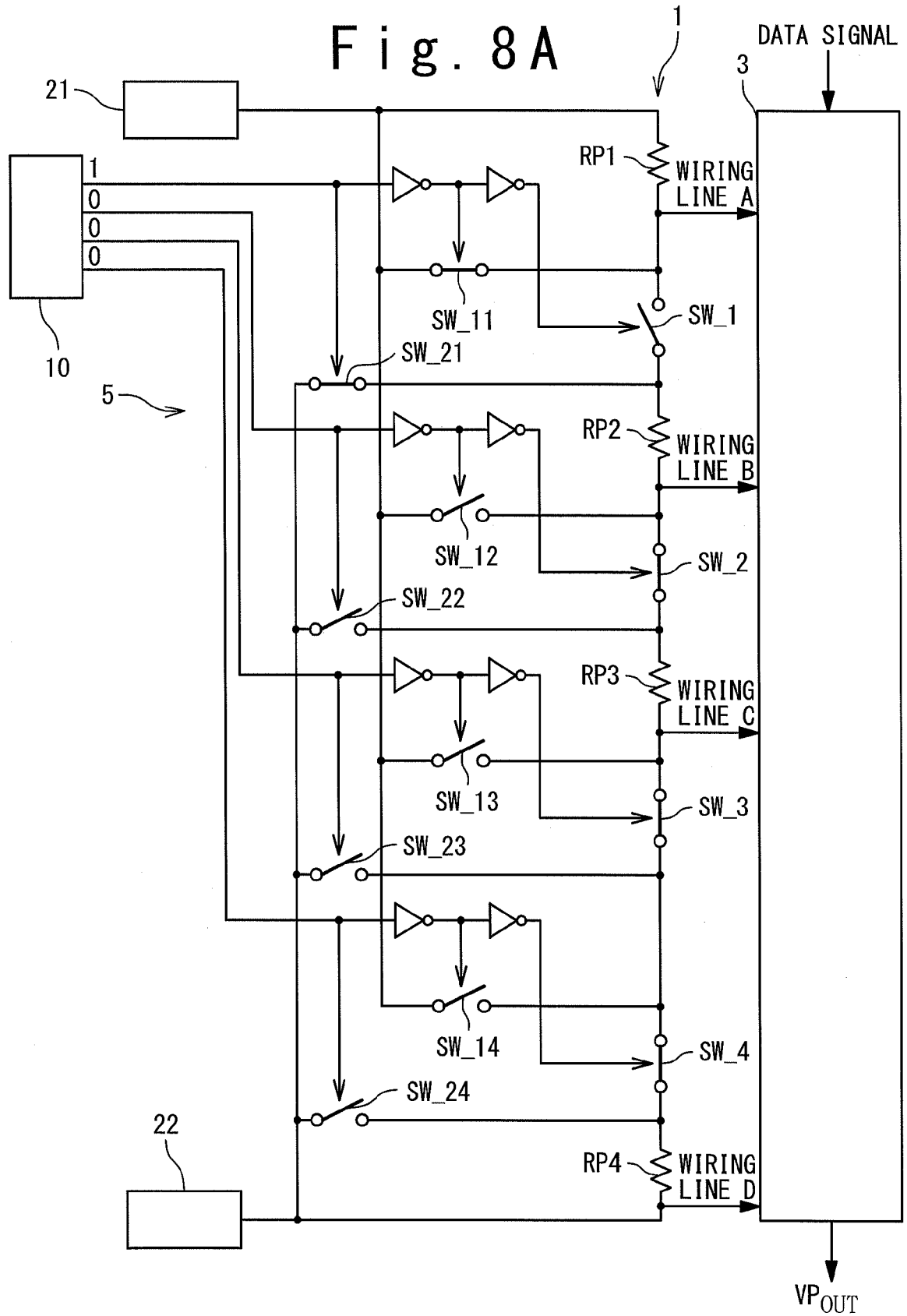

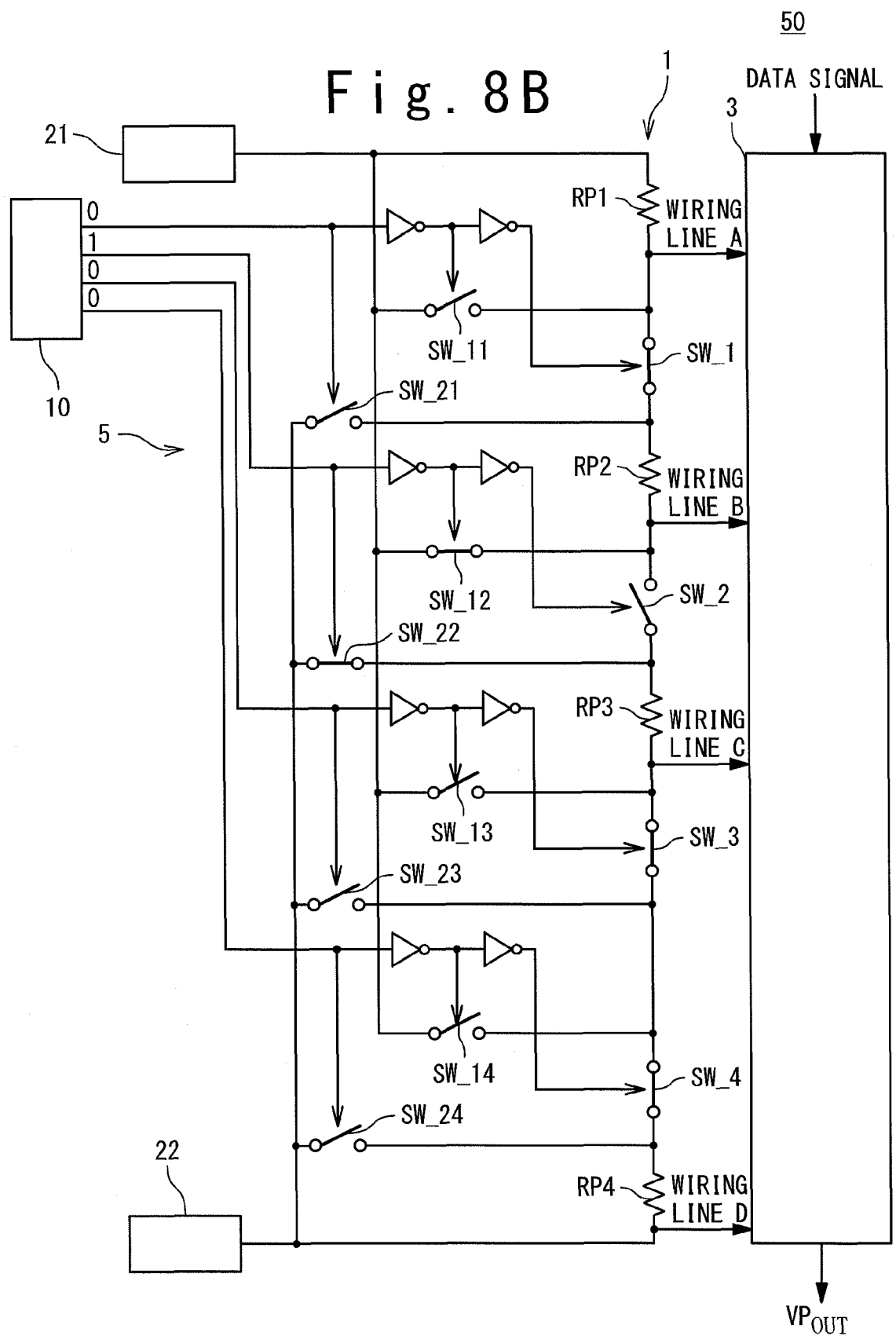

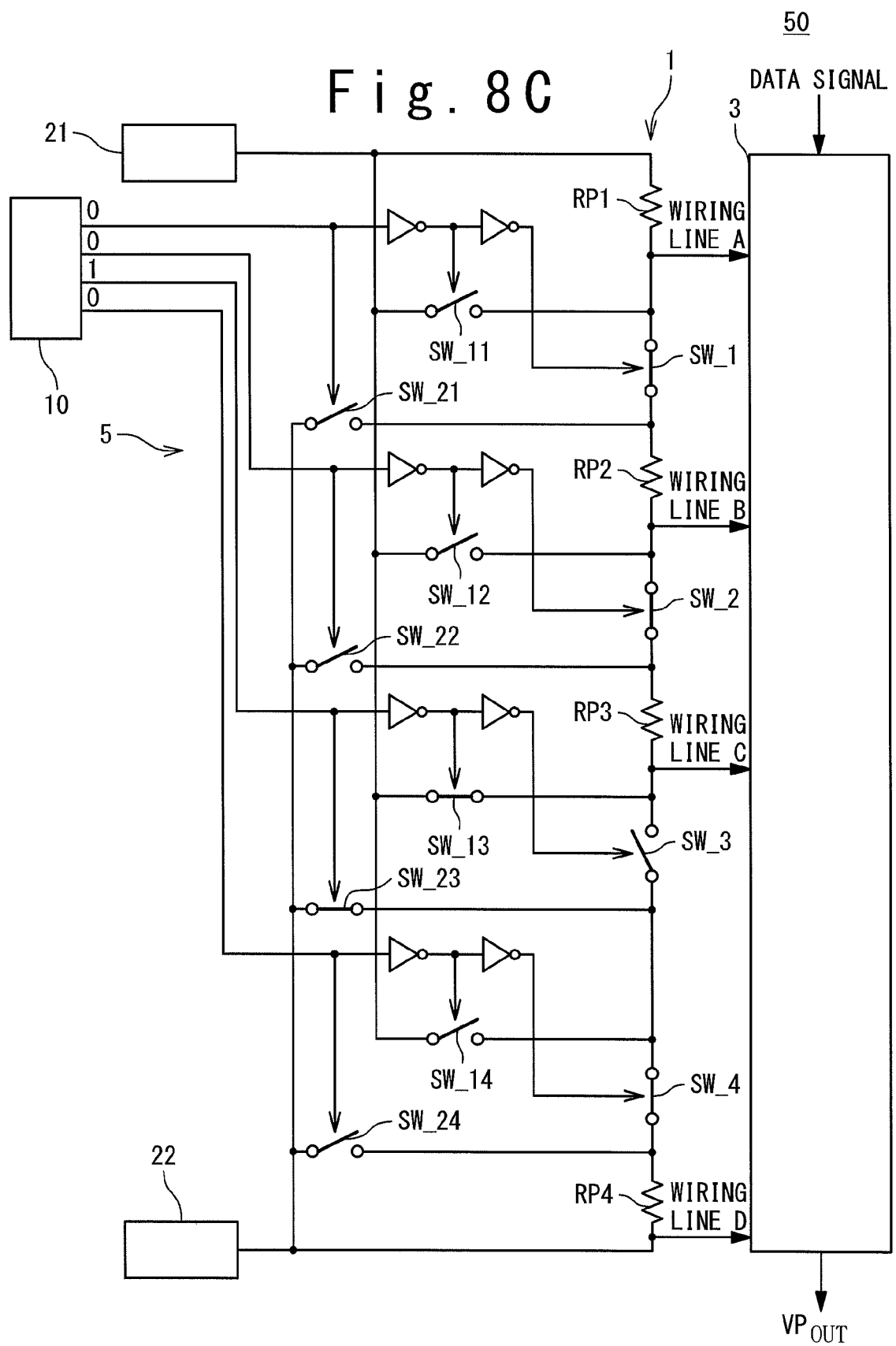

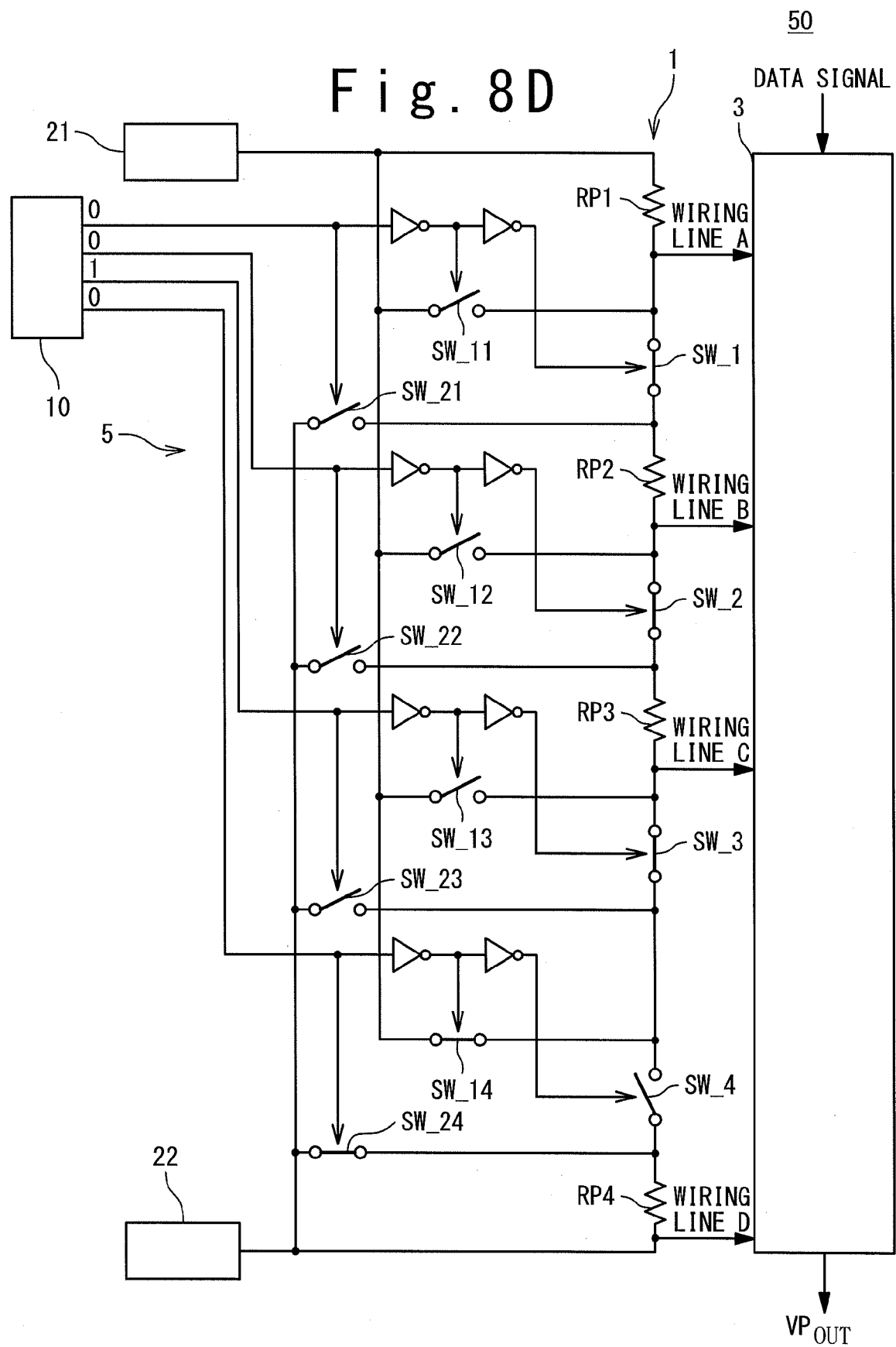

SEMICONDUCTOR INTEGRATED CIRCUIT AND METHOD OF TESTING CIRCUIT

INCORPORATION BY REFERENCE

This application is based upon and claims the benefit of priority from Japanese patent application No. 2009-185028 filed on Aug. 7, 2009, the disclosure of which is incorporated herein in its entirety by reference.

BACKGROUND OF THE INVENTION

1. Field of the Invention

The present invention relates to a semiconductor integrated circuit and a method of testing a circuit, and more particularly relates to a circuit for detecting a leakage current of a transistor used for a data processing circuit in a driver IC for a displaying apparatus.

2. Description of Related Art

A semiconductor integrated circuit is required to attain a smaller size and a higher function from year to year and to treat a large quantity of data at a high speed. For this reason, a circuit configuration is highly integrated, and a micro leakage current may result in a fatal wound of a product. Before a product is shipped, rejecting this micro current is duty of a manufacturer. Thus, it becomes necessary to design a circuit for attaining the rejection.

As the foregoing semiconductor integrated circuit, for example, a data processing circuit in a driver IC for a displaying apparatus is known. A typical measuring method of a leakage current of a ROM decoder included in the data processing circuit will be described below. FIG. 1 is a schematic view showing the typical measuring method of the leakage current of the ROM decoder. Here, FIG. 1 shows, as an example, the measuring method of the leakage current of the ROM decoder with a P-type 2-bit 4-gradation specification. A (P-type) ROM decoder 103 is provided with (P-type) enhancement type transistors 106 and (P-type) depletion type transistors 107, which are arranged in the shape of a matrix. Moreover, those transistors constitute series circuits in a row direction, and their one ends are connected to the respective connection points of a ladder resistor 101. The transistor gates of respective columns are commonly connected. Data signals DA, DB are supplied to the odd-numbered columns, and the inversion signals /DA, /DB of the data signals DA, DB are supplied to the even-numbered columns. One series circuit for selecting a gradation voltage from the ladder resistor 101 is selected by using these signals. A voltage of a power source 121 is supplied to the thus-selected series circuit, and this is also supplied to both ends of the other series circuits. Thus, it is possible to select the leakage current inside the ROM decoder 103.

In relation to the measuring method of the leakage current of the ROM decoder, Japanese patent publication No. JP-A-Heisei 11-264855 (Japanese Patent No. 3186688) discloses an integrated circuit apparatus. FIG. 2 is a schematic view showing a configuration of the integrated circuit apparatus in JP-A-Heisei 11-264855. This integrated circuit apparatus includes ladder resistors (101, 102), ROM decoders (103, 104) and a test circuit (105). In the ladder resistor 101, a predetermined number of resistors RP1 to RP63 are connected in series, compensation power source voltages V1 to V5 are supplied to at least one of connection points PP1 to PP64 of the resistors RP1 to RP63, and gradation voltages are generated at all of the connection points. Data signals are supplied to the ROM decoder 103, and one gradation voltage from the ladder resistor 101 is selected. The test circuit 105 measures a leakage current of the ROM decoder 103. The test circuit 105 has a shorting means 112 for shorting the predetermined number of the respective resistors RP when the leakage current is measured.

Similarly, in the ladder resistor 102, a predetermined number of resistors RN1 to RN63 are connected in series, compensation power source voltages V6 to V10 are supplied to at least one of connection points PN1 to PN64 of the resistors RN1 to RN63, and gradation voltages are generated at all of the connection points. Data signals are supplied to the ROM decoder 104, and one gradation voltage from the ladder resistor 102 is selected. The test circuit 105 measures a leakage current of the ROM decoder 104. The test circuit 105 has a shorting means 113 for shorting the predetermined number of the respective resistors RN when the leakage currents are measured.

That is, this integrated circuit apparatus, when measuring the respective leakage currents inside the P-type ROM decoder 103 and the N-type ROM decoder 104, executes the following measuring method. At first, when the leakage current inside the P-type ROM decoder 103 is measured, the respective division resistors RP1 to RP63 inside the ladder resistor 101 are shorted through shorting transistors 112 connected in parallel. Then, a test voltage VTP is supplied from terminals V1, V5 through a current meter to both ends of the ladder resistor 101. Consequently, the test voltage is supplied to all of the connection points PP1 to PP64 between the division resistors RP1 and RP63. At this time, since a data signal for testing is supplied from a fore-stage circuit inside the integrated circuit apparatus to the P-type ROM decoder 103, the leakage current of the P-type ROM decoder 103 can be measured by the current meter at a high precision. Similarly, when a leakage current inside the N-type ROM decoder 104 is measured, the respective division resistors RN1 to RN63 inside the ladder resistor 102 are shorted through shorting transistors 113 connected in parallel. Then, a test voltage VTN is supplied from terminals V6, V10 through a current meter to both ends of the ladder resistor 102. Consequently, the test voltage is supplied to all of the connection points PN1 to PN64 between the division resistors RN1 and RN63. At this time, since a data signal for testing is supplied from a fore-stage circuit inside the integrated circuit apparatus to the N-type ROM decoder 104, the leakage current of the N-type ROM decoder 104 can be measured by the current meter at the high precision.

As a related technique, Japanese patent publication No. JP-A-Heisei 10-213616 discloses a technique of a liquid crystal driving integrated circuit and a testing method of the same. This liquid crystal driving integrated circuit includes a plurality of liquid crystal driving output circuits, a plurality of liquid crystal driving output terminals, and a test control circuit. Each of the plurality of liquid crystal driving output circuits is composed of an operation amplifying circuit. The plurality of liquid crystal driving output terminals is connected to the respective output nodes of the plurality of liquid crystal driving output circuits, correspondingly thereto. The test control circuit divides the plurality of liquid crystal driving output circuits into a plurality of groups so as to create combinations of the partial liquid crystal driving output circuits. Each combination includes a part of the plurality of the liquid crystal driving output circuits, corresponding to output terminals. The output terminals are intermittently selected from the plurality of liquid crystal driving output terminals such that the output terminals adjacent to each other are not included. The test control circuit, then, selects groups from the plurality of groups at the time of the current leakage test, and controls the liquid crystal driving output circuits belonging to the selected groups to the high output impedance states, respectively, and also controls the liquid crystal driving output circuits adjacent to the liquid crystal driving output circuits belonging to the selected groups to the output states of the constant voltages, respectively.

I have now discovered the following facts.

In the above technique, as for the leakage current inside the ROM decoder, the two or more power sources are set to the same voltage, and the leakage current of each gradation line is measured through the ladder resistor linked to the ROM decoder. For example, in FIG. 1, as for the leakage current inside the ROM decoder 103, the two power sources 121, 122 are set to the same voltage, and the leakage current of each gradation line is measured through the ladder resistor 101 linked to the ROM decoder. Also, in FIG. 2, for example, as for the leakage current inside the ROM decoder 103, the terminals V1, V5 (the two power sources) are set to the same voltage VTP, and the leakage current of each gradation line is measured through the shorting transistor 112 linked to the ROM decoder 103.

However, in the foregoing measuring methods, the same potential is generated between the source and the drain of the transistor configuring the ROM decoder. Thus, there is a problem that a leakage current between the source and the drain cannot be measured in the case when the transistor is in an off-state.

SUMMARY OF THE INVENTION

The present invention seeks to solve one or more of the above problems, or to improve upon those problems at least in part.

In one embodiment, a semiconductor integrated circuit includes: a ladder resistor configured to include a plurality of resistors series-connected to each other and be supplied with a correction voltage at least one of both ends of the series connection and a plurality of connection points in the series connection to generate a plurality of gradation voltages at the plurality of connection points; a ROM decoder configured to select one of the plurality of gradation voltages generated by the ladder resistor, based on a supplied data signal; and a test circuit configured to measure a leakage current in the ROM decoder, wherein the test circuit includes: a plurality of separation units configured to separate the series connection, which is respectively supplied with different power source voltages at both ends, at a certain portion, when the leakage current is measured; and a control unit configured to control separation of the plurality of separation unit corresponding to the data signal.

In another embodiment, a method of testing a ROM decoder of a semiconductor integrated circuit, wherein the semiconductor integrated circuit includes: a ladder resistor configured to include a plurality of resistors series-connected to each other and be supplied with a correction voltage at least one of both ends of the series connection and a plurality of connection points in the series connection to generate a plurality of gradation voltages at the plurality of connection points; a ROM decoder configured to select one of the plurality of gradation voltages generated by the ladder resistor, based on a supplied data signal; and a test circuit configured to measure a leakage current in the ROM decoder, the method includes: supplying a data signal to the ROM decoder; supplying different power source voltages at both ends of the series connection; separating the series connection at a certain portion based on the data signal; and measuring a leakage current of the ROM decoder.

According to the semiconductor integrated circuit apparatus of the present invention, it is possible to measure a leakage current even in the case when a transistor of a ROM decoder is in an off-state.

BRIEF DESCRIPTION OF THE DRAWINGS

The above and other objects, advantages and features of the present invention will be more apparent from the following description of certain preferred embodiments taken in conjunction with the accompanying drawings, in which:

FIG. 4C is a circuit block diagram schematically showing the operation of the semiconductor integrated circuit according to the first embodiment of the present invention;

FIG. 6C is an equivalent circuit diagram showing a voltage state inside a ROM decoder in the case of FIG. 4C;

FIG. 7 is a circuit block diagram showing a configuration of a semiconductor integrated circuit according to a second embodiment of the present invention;

FIG. 8A is a circuit block diagram schematically showing an operation of the semiconductor integrated circuit according to the second embodiment of the present invention;

FIG. 8B is a circuit block diagram schematically showing the operation of the semiconductor integrated circuit according to the second embodiment of the present invention;

FIG. 8C is a circuit block diagram schematically showing the operation of the semiconductor integrated circuit according to the second embodiment of the present invention; and FIG. 8D is a circuit block diagram schematically showing the operation of the semiconductor integrated circuit according to the second embodiment of the present invention.

DESCRIPTION OF THE PREFERRED EMBODIMENTS

The invention will be now described herein with reference to illustrative embodiments. Those skilled in the art will recognize that many alternative embodiments can be accomplished using the teachings of the present invention and that the invention is not limited to the embodiments illustrated for explanatory purposed.

The embodiments of the semiconductor integrated circuit according to the present invention will be described below with reference to the attached drawings. In the embodiments, a P-type ROM decoder with 2-bit and 4-gradation specification will be described. However, the present invention can be similarly applied to even an N-type ROM decoder. Moreover, the present invention can be similarly applied to even a multiple-gradation case.

First Embodiment

Figure 3:
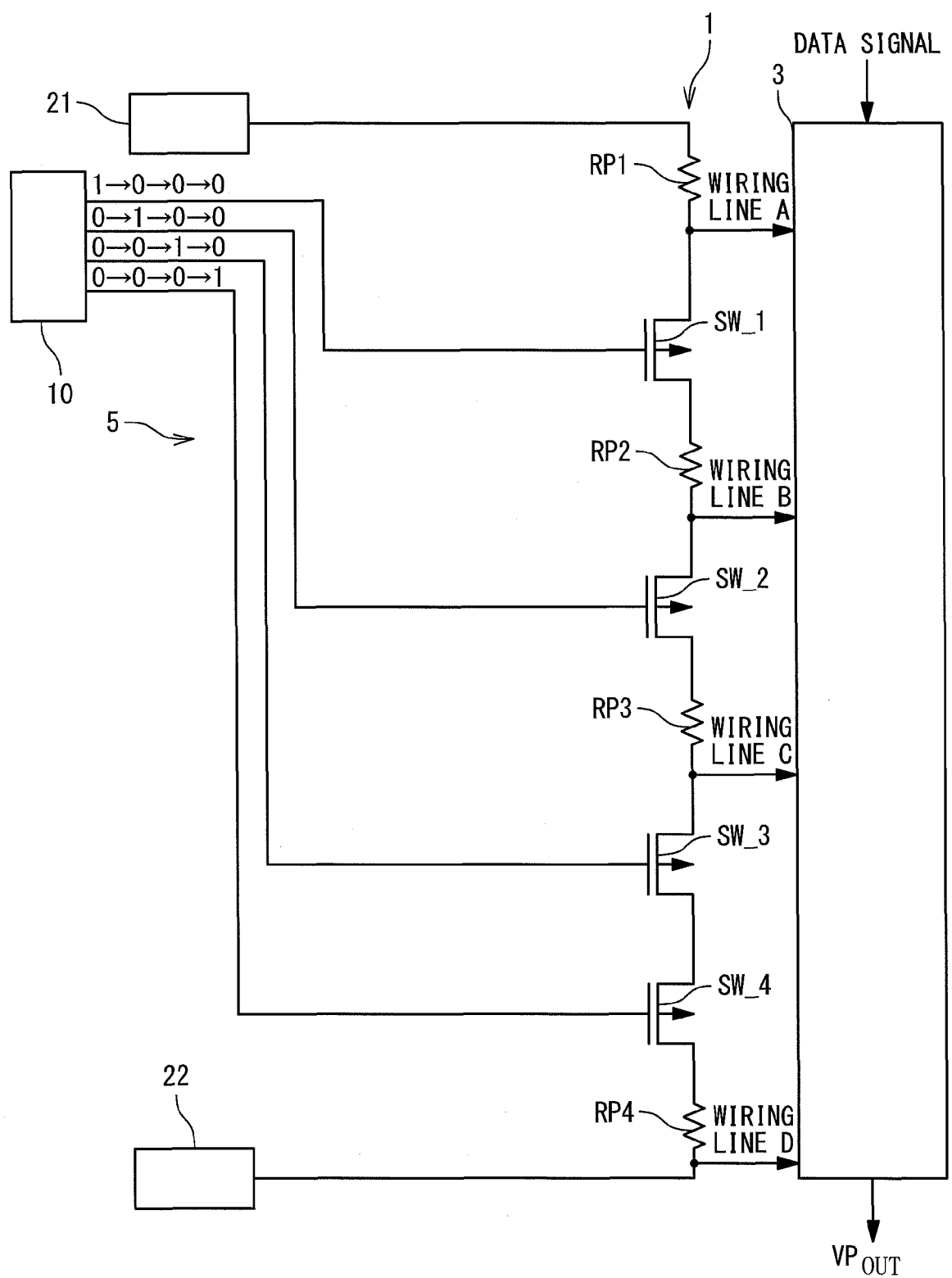
FIG. 3 is a circuit block diagram showing a configuration of a semiconductor integrated circuit according to a first embodiment of the present invention.

A configuration of a semiconductor integrated circuit according to the first embodiment of the present invention is described. FIG. 3 is a circuit block diagram showing the configuration of the semiconductor integrated circuit according to the first embodiment of the present invention. A semiconductor integrated circuit 50 includes a ladder resistor 1, a ROM decoder 3 and a test circuit 5.

The ladder resistor 1 includes a plurality of resistors RP1 to RP4 connected in series. The plurality of resistors RP1 to RP4 has connection points at both ends of the series connection and between the resistors adjacent to each other. These connection points are connected to wiring lines except a part thereof. That is, a wiring line A is connected to the connection point between the resistor RP1 and the resistor RP2. Similarly, a wiring line B is connected to the connection point between the resistor RP2 and the resistor RP3. A wiring line C is connected to the connection point between the resistor RP3 and the resistor RP4. A wiring line D is connected to the connection point between the resistor RP4 and a power source 22. In the ladder resistor 1, a voltage difference between different γ compensation voltages, which are respectively supplied to both ends of the series connection, is divided by the plurality of resistors RP1 to RP4 into a plurality of gradation voltages generated at each of the plurality of connection points. The plurality of gradation voltages is outputted respectively through the wiring lines A to D to the ROM decoder 3. Incidentally, a γ compensation voltage may be further supplied to a different portion. For example, a γ compensation voltage, which is greater than the smaller γ compensation voltage and smaller than the greater γ compensation voltage supplied to the both ends, may be supplied to the portion between the resistor RP2 and the resistor RP3.

The ROM decoder 3 selects one of the plurality of gradation voltages generated in the ladder resistor 1 based on a supplied data signal and outputs, for example, as a positive output voltage $VP_{OUT}$. FIG. 3 shows a P-type ROM decoder 3 as one example. The P-type ROM decoder 3 is exemplified in the same structure as the P-type ROM decoder 103 indicated in FIG. 1. That is, the (P-type) ROM decoder 3 includes (P-type) enhancement type transistors 6 and (P-type) depletion type transistors 7, which are arranged in the shape of a matrix. Each row has a transistor series circuit provided with a plurality of pairs, in which one pair is composed of two transistors, one is the enhancement type transistor 6 and the other is the depletion type transistor 7 that are adjacent to each other. One end of the transistor series circuit is connected to corresponding one connection point of the ladder resistor 1. The other end of the transistor series circuit is mutually connected to the other ends of the other transistor series circuits to be connected to a post-stage circuit (not shown). In each column, gates of the transistors are mutually connected. Then, from a fore-stage circuit (not shown), the data signals DA, DB, - - - are supplied to the odd-numbered columns, and the inversion signals /DA, /DB, - - - of the data signals DA, DB, - - - are supplied to the even-numbered columns.

The test circuit 5 supplies different power source voltages through the ladder resistor 1 to the ROM decoder 3 and measures the leakage current of the ROM decoder 3. The test circuit 5 includes a plurality of separation switches SW_1 to SW_4, a plurality of power sources 21, 22 and a controller 10.

The plurality of separation switches SW_1 to SW_4 can separate the series connection of the ladder resistor 1 at a predetermined portion (separating portion), based on control of the controller 10, when the leakage current is measured. That is, each of the plurality of separation switches SW_1 to SW_4 is the switch placed between adjacent two of the plurality of resistors RP in the ladder resistor 1, and this is exemplified as the transistor. For example, this is a PMOS transistor that is turned off by a High ("1") signal and turned on by a Low ("0") signal. The separation switch SW_1 is placed between the resistors RP1, RP2 and can separate the connection between both the resistors. The separation switch SW_2 is placed between the resistors RP2, RP3 and can separate the connection between both the resistors. The separation switch SW_3 is placed between the resistors RP3, RP4 and can separate the connection between both the resistors. The separation switch SW_4 is placed between the resistors RP3, RP4 and can separate the connection between both the resistors.

Incidentally, the separation switch SW_4 may not be used. In this case, an OR circuit may perform a logical sum of outputs to the separation switches SW_3, SW_4 from the controller 10, and it may be supplied to the separation switch SW_3.

The power source 21 supplies a first power source voltage through a current meter (not shown) to the end of the series connection on the side of the resistor RP1, when the leakage current is measured. Consequently, the first power source voltage can be supplied not only to the end of the series connection on the side of the resistor RP1, but also to the connection point on the side of the resistor RP1 from a separating portion that separates the series connection and is one of the separation switches SW_1 to SW_4. On the other hand, the power source 22 supplies a second power source voltage through a current meter (not shown) to the end of the series connection on the side of the resistor RP4, when the leakage current is measured. Consequently, the second power source voltage can be supplied not only to the end of the series connection on the side of the resistor RP4, but also to the connection point on the side of the resistor RP4 from the separating portion that separates the series connection and is one of the separation switches SW_1 to SW_4. That is, the first and second power source voltages that differ from each other can be supplied respectively to both sides of the separating portion of one of the separation switches SW. Incidentally, external power sources that are not included in the test circuit 5 may be used for the plurality of power sources 21, 22.

The controller 10 controls the separation at each of the plurality of separation switches SW_1 to SW_4, correspondingly to data signals supplied to the ROM decoder 3. That is, the controller 10 sets any of the plurality of separation switches SW_1 to SW_4 to the separation state and sets the others to the connection state.

At the time except the measurement of the leakage current, the plurality of separation switches SW_1 to SW_4 are all set to the connection state, for the sake of the primary operation of the ladder resistor 1.

An operation of the semiconductor integrated circuit according to the first embodiment of the present invention will be described below. FIGS. 4A to 4D are circuit block diagrams schematically showing an operation of the semiconductor integrated circuit according to the first embodiment of the present invention. FIGS. 5A to 5D are equivalent circuit diagrams schematically showing states of the semiconductor integrated circuit in the cases of FIGS. 4A to 4D. FIGS. 6A to 6D are equivalent circuit diagrams schematically showing voltage states inside the ROM decoder in the cases of FIGS. 4A to 4D.

Figure 4A:
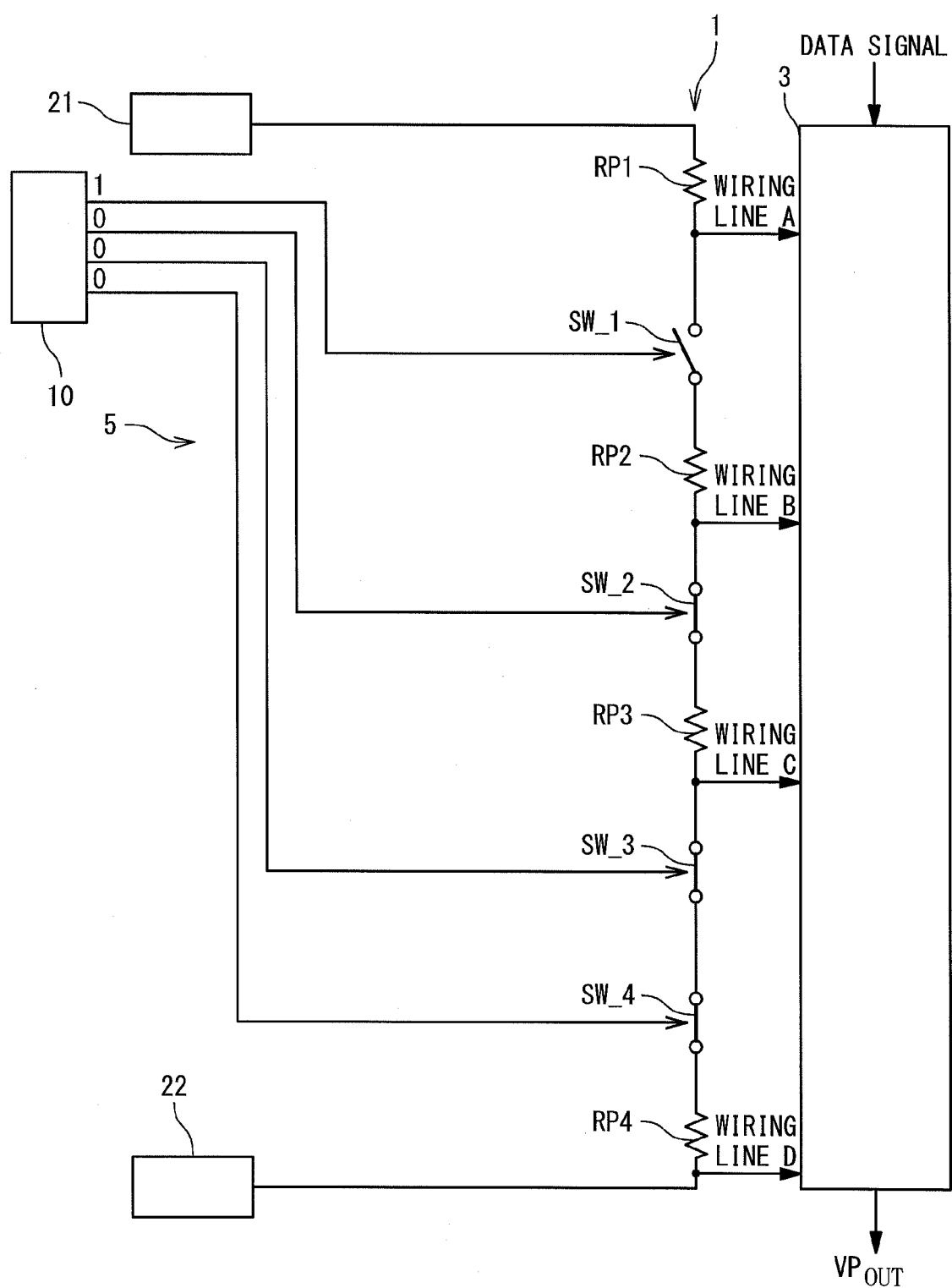
FIG. 4A is a circuit block diagram schematically showing an operation of the semiconductor integrated circuit according to the first embodiment of the present invention.

With reference to FIG. 3, all of the transistors in the series circuit inside the ROM decoder 3 linked to the wiring line A are turned on by the data signal to the ROM decoder 3 from the fore-stage circuit (not shown). Simultaneously, the controller 10 supplies a signal (1000) to the separation switches SW_1 to SW_4 correspondingly to the data signal. Thus, the PMOS transistor of the separation switch SW_1 is turned off and becomes in the separation state. On the other hand, the PMOS transistors of the separation switches SW_2 to SW_4 are turned on and become in the connection state. As a result, the wiring line A and the wiring lines B to D are separated as shown in FIG. 4A. Then, the first power source voltage of the power source 21 is supplied to the wiring line A. On the other hand, the second power source voltage of the power source 22 is supplied to the wiring lines B to D directly or through the separation switches SW_2 to SW_4 of the connection state.

Figure 5A:
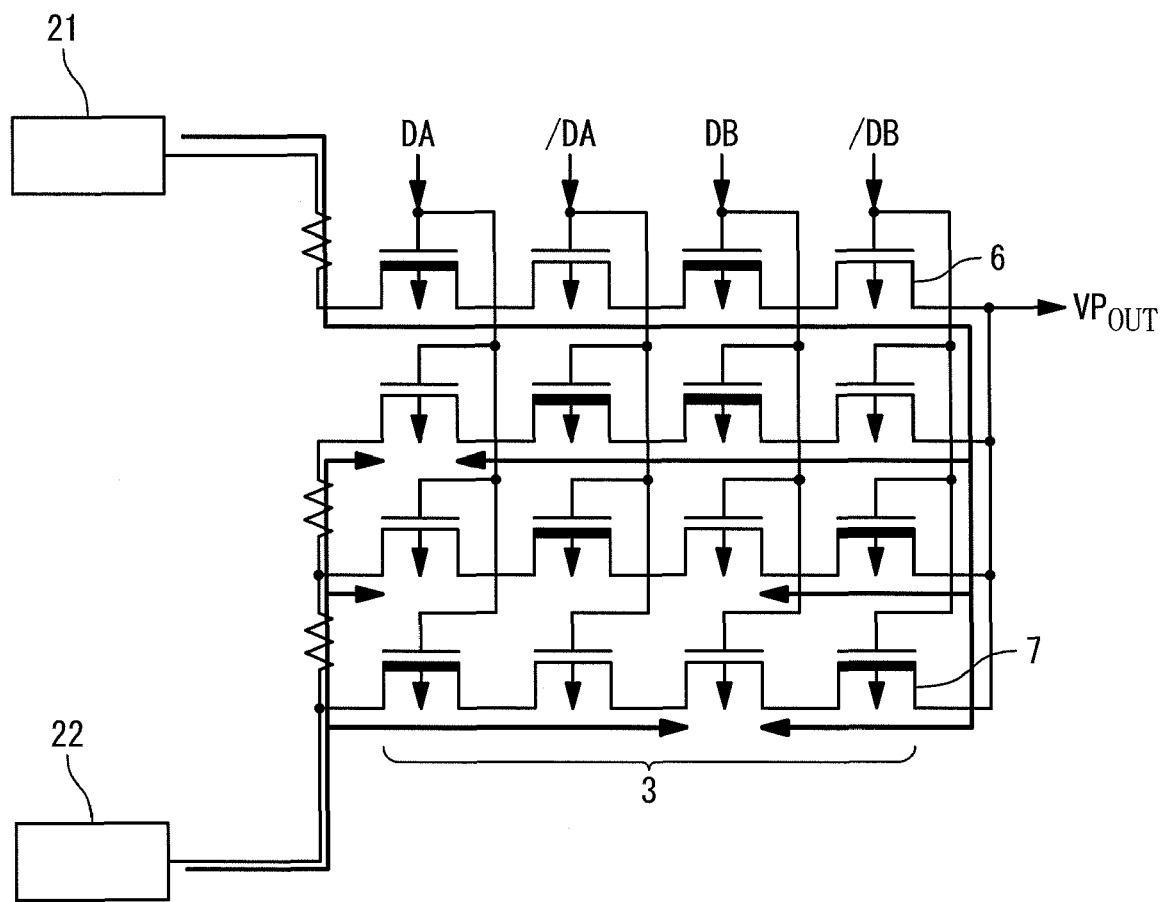
FIG. 5A is an equivalent circuit diagram schematically showing the semiconductor integrated circuit in the case of FIG. 4A.

At this time, as shown in FIG. 5A, all of the transistors in the series circuit inside the ROM decoder 3 linked to the wiring line A are turned on by the data signal to the ROM decoder 3. Thus, the first power source voltage of the power source 21 is supplied through the series circuit inside the ROM decoder 3 to the transistors inside the ROM decoder 3 linked to the wiring lines B to D. On the other hand, the second power source voltage of the power source 22 is supplied from the side of the wiring lines B to D, which is opposite to the side of the wiring line A, to the transistors linked to the wiring lines B to D. Thus, the off transistors, which are turned off, inside the ROM decoder 3 linked to the wiring lines B to D become in the state in which the different power source voltages such as the first and second power source voltages are applied between the sources and the drains. Hence, it is possible to measure the leakage current when the transistors linked to the wiring lines B to D are turned off.

Figure 6A:
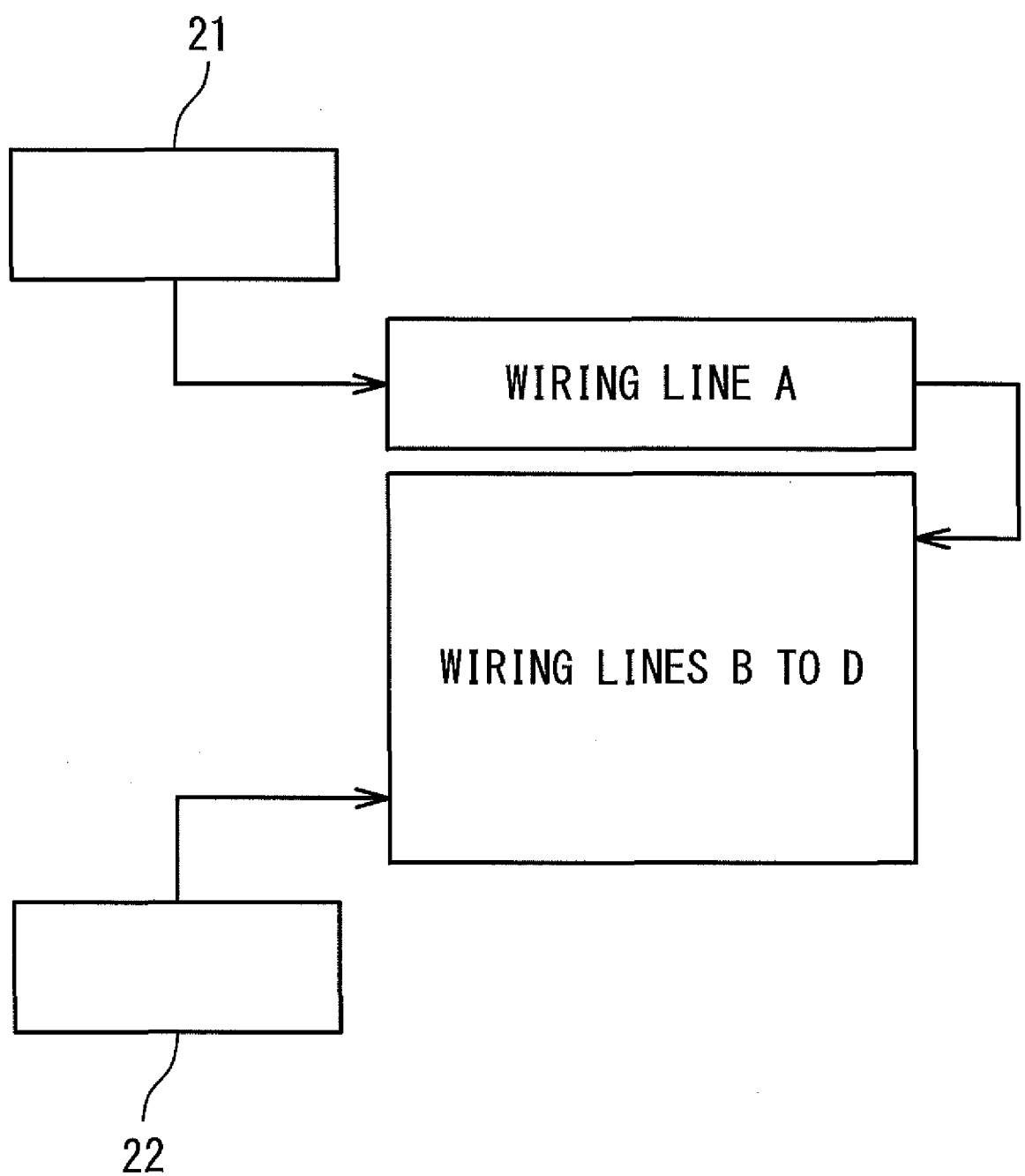
FIG. 6A is an equivalent circuit diagram showing a voltage state inside a ROM decoder in the case of FIG. 4A.

This is because the test circuit 5 is controlled such that the second power source voltage differing from the first power source voltage is applied to the transistors in the series circuits linked to the wiring lines B to D, although the first power source voltage is applied to the transistors in the series circuit linked to the wiring line A, as shown in FIG. 6A.

Figure 4B:
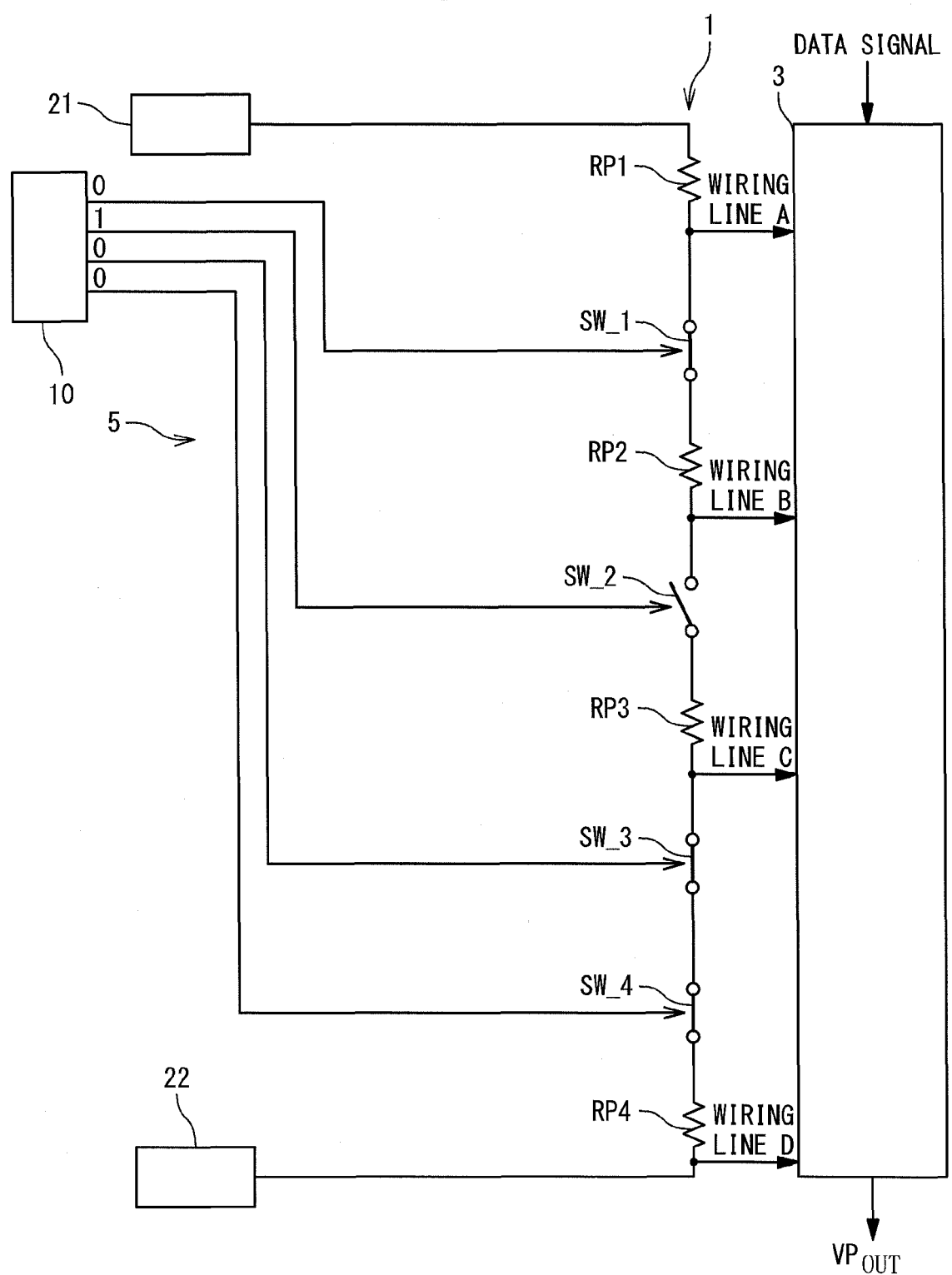
FIG. 4B is a circuit block diagram schematically showing the operation of the semiconductor integrated circuit according to the first embodiment of the present invention.

Similarly, with reference to FIG. 3, all of the transistors in the series circuit inside the ROM decoder 3 linked to the wiring line B are turned on by the data signal to the ROM decoder 3 from the fore-stage circuit (not shown). Simultaneously, the controller 10 supplies a signal (0100) to the separation switches SW_1 to SW_4 correspondingly to the data signal. Thus, the PMOS transistor of the separation switch SW_2 is turned off and becomes in the separation state. On the other hand, the PMOS transistors of the separation switches SW_1, SW_3, SW_4 are turned on and become in the connection state. As a result, the wiring lines A, B and the wiring lines C, D are separated as shown in FIG. 4B. Then, the first power source voltage of the power source 21 is supplied to the wiring lines A, B directly or through the separation switch SW_1 of the connection state. On the other hand, the second power source voltage of the power source 22 is supplied to the wiring lines C, D directly or through the separation switches SW_3, SW_4 of the connection state.

Figure 5B:
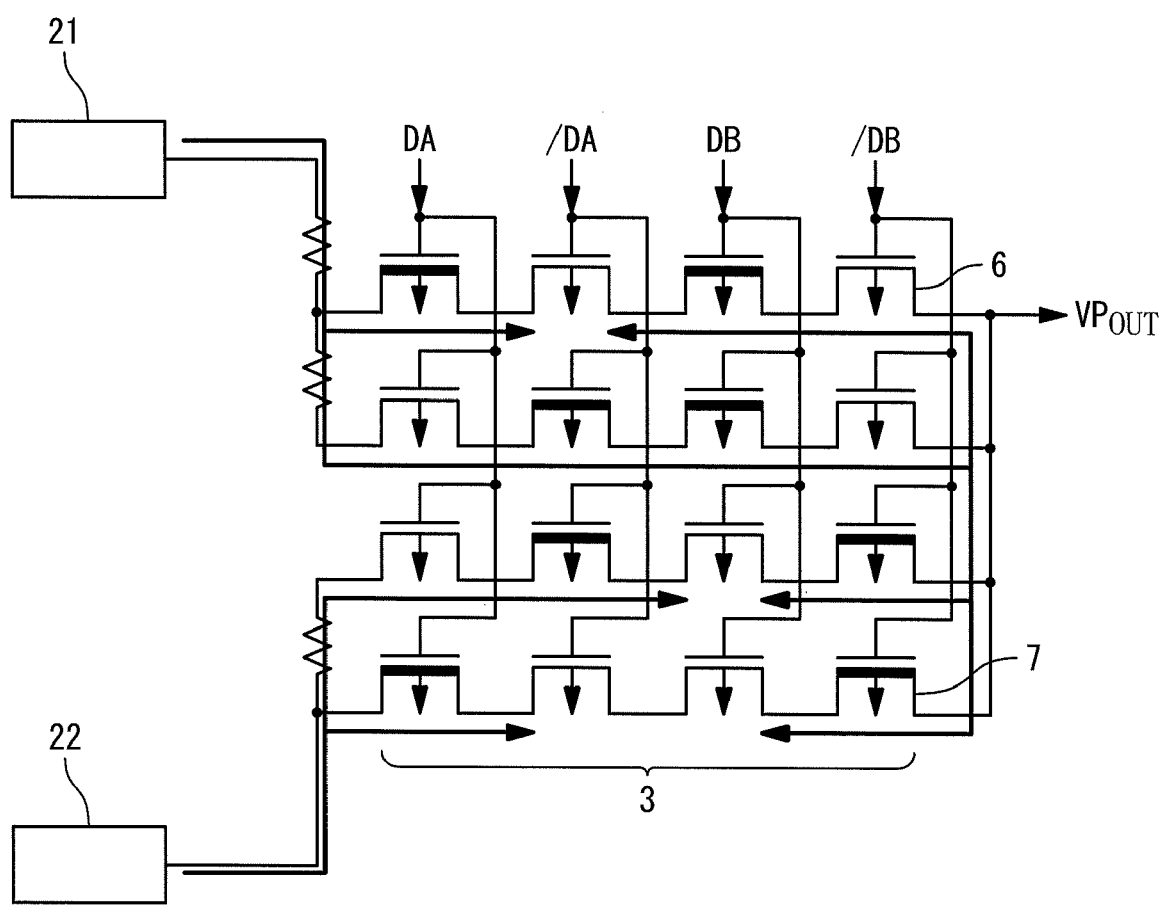
FIG. 5B is an equivalent circuit diagram schematically showing the semiconductor integrated circuit in the case of FIG. 4B.

At this time, as shown in FIG. 5B, all of the transistors in the series circuit inside the ROM decoder 3 linked to the wiring line B are turned on by the data signal to the ROM decoder 3. Thus, the first power source voltage of the power source 21 is supplied through the series circuit inside of the ROM decoder 3 to the transistors inside the ROM decoder 3 linked to the wiring line A and the wiring lines C, D. On the other hand, the second power source voltage of the power source 22 is supplied from the side of the wiring lines C, D, which is opposite to the side of the wiring lines A, B, to the transistors linked to the wiring lines C, D. Thus, the off transistors inside the ROM decoder 3 linked to the wiring lines C to D become in the state in which the different power source voltages such as the first and second power source voltages are applied between the sources and the drains. Hence, it is possible to measure the leakage current when the transistors linked to the wiring lines C to D are turned off.

Figure 6B:
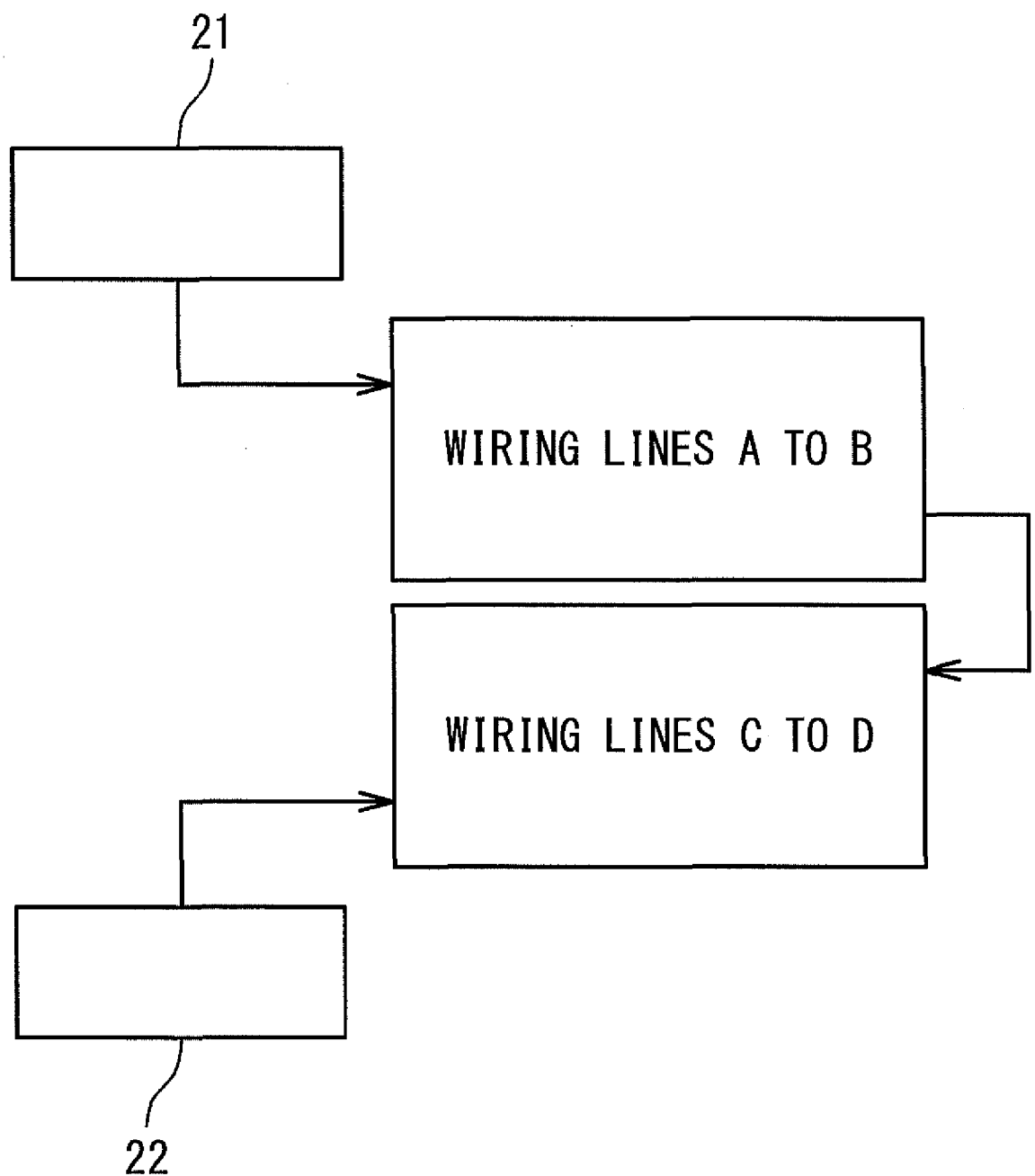
FIG. 6B is an equivalent circuit diagram showing a voltage state inside a ROM decoder in the case of FIG. 4B.

This is because the test circuit 5 is controlled such that the second power source voltage differing from the first power source voltage is applied to the transistors in the series circuits linked to the wiring lines C, D, although the first power source voltage is applied to the transistors in the series circuit linked to the wiring lines A, B, as shown in FIG. 6B.

Similarly, with reference to FIG. 3, all of the transistors in the series circuit inside the ROM decoder 3 linked to the wiring line C are turned on by the data signal to the ROM decoder 3 from the fore-stage circuit (not shown). Simultaneously, the controller 10 supplies a signal (0010) to the separation switches SW_1 to SW_4 correspondingly to the data signal. Thus, the PMOS transistor of the separation switch SW_3 is turned off and becomes in the separation state. On the other hand, the PMOS transistors of the separation switches SW_1, SW_2, SW_4 are turned on and become in the connection state. As a result, the wiring lines A to C and the wiring line D are separated as shown in FIG. 4C. Then, the first power source voltage of the power source 21 is supplied to the wiring lines A to C directly or through the separation switches SW_1, SW_2 of the connection state. On the other hand, the second power source voltage of the power source 22 is supplied to the wiring line D.

Figure 5C:
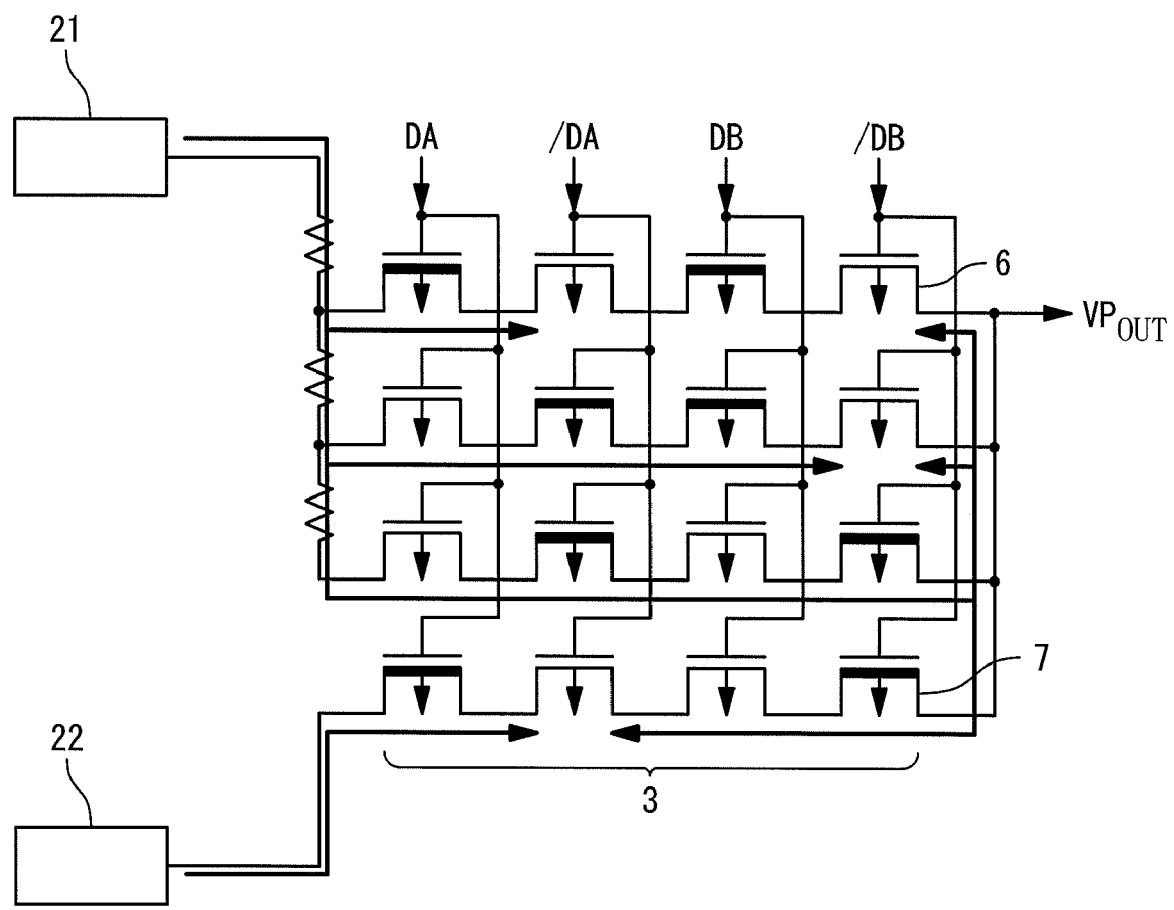
FIG. 5C is an equivalent circuit diagram schematically showing the semiconductor integrated circuit in the case of FIG. 4C.

At this time, as shown in FIG. 5C, all of the transistors in the series circuit inside the ROM decoder 3 linked to the wiring line C are turned on by the data signal to the ROM decoder 3. Thus, the first power source voltage of the power source 21 is supplied through the series circuit inside the ROM decoder 3 to the transistors inside the ROM decoder 3 linked to the wiring lines A, B and the wiring D. On the other hand, the second power source voltage of the power source 22 is supplied from the side of the wiring line D, which is opposite to the side of the wiring line C, to the transistors linked to the wiring line D. Thus, the off transistors inside the ROM decoder 3 linked to the wiring line D become in the state in which the different power source voltages such as the first and second power source voltages are applied between the sources and the drains. Hence, it is possible to measure the leakage current when the transistors linked to the wiring line D are turned off.

This is because the test circuit 5 is controlled such that the second power source voltage differing from the first power source voltage is applied to the transistors in the series circuit linked to the wiring line D, although the first power source voltage is applied to the transistors in the series circuits linked to the wiring lines A to C, as shown in FIG. 6C.

Figure 4D:
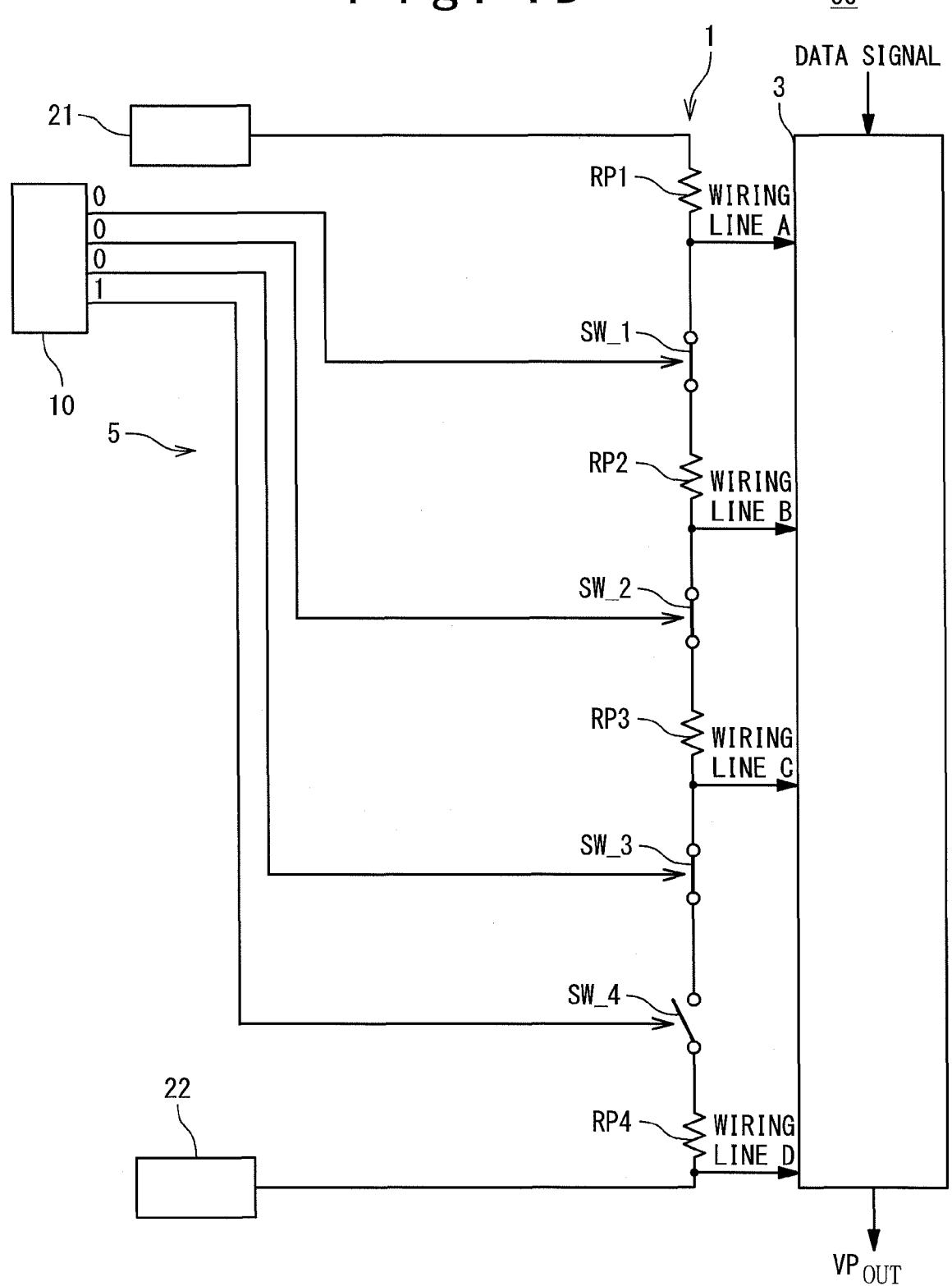
FIG. 4D is a circuit block diagram schematically showing the operation of the semiconductor integrated circuit according to the first embodiment of the present invention.

Similarly, with reference to FIG. 3, all of the transistors in the series circuit inside the ROM decoder 3 linked to the wiring line D are turned on by the data signal to the ROM decoder 3 from the fore-stage circuit (not shown). Simultaneously, the controller 10 supplies a signal (0001) to the separation switches SW_1 to SW_4 correspondingly to the data signal. Thus, the PMOS transistor of the separation switch SW_4 is turned off and becomes in the separation state. On the other hand, the PMOS transistors of the separation switches SW_1 to SW_3 are turned on and become in the connection state. As a result, the wiring lines A to C and the wiring line D are separated as shown in FIG. 4D. Then, the first power source voltage of the power source 21 is supplied to the wiring lines A to C directly or through the separation switches SW_1, SW_2 of the connection state. On the other hand, the second power source voltage of the power source 22 is supplied to the wiring line D.

Figure 5D:
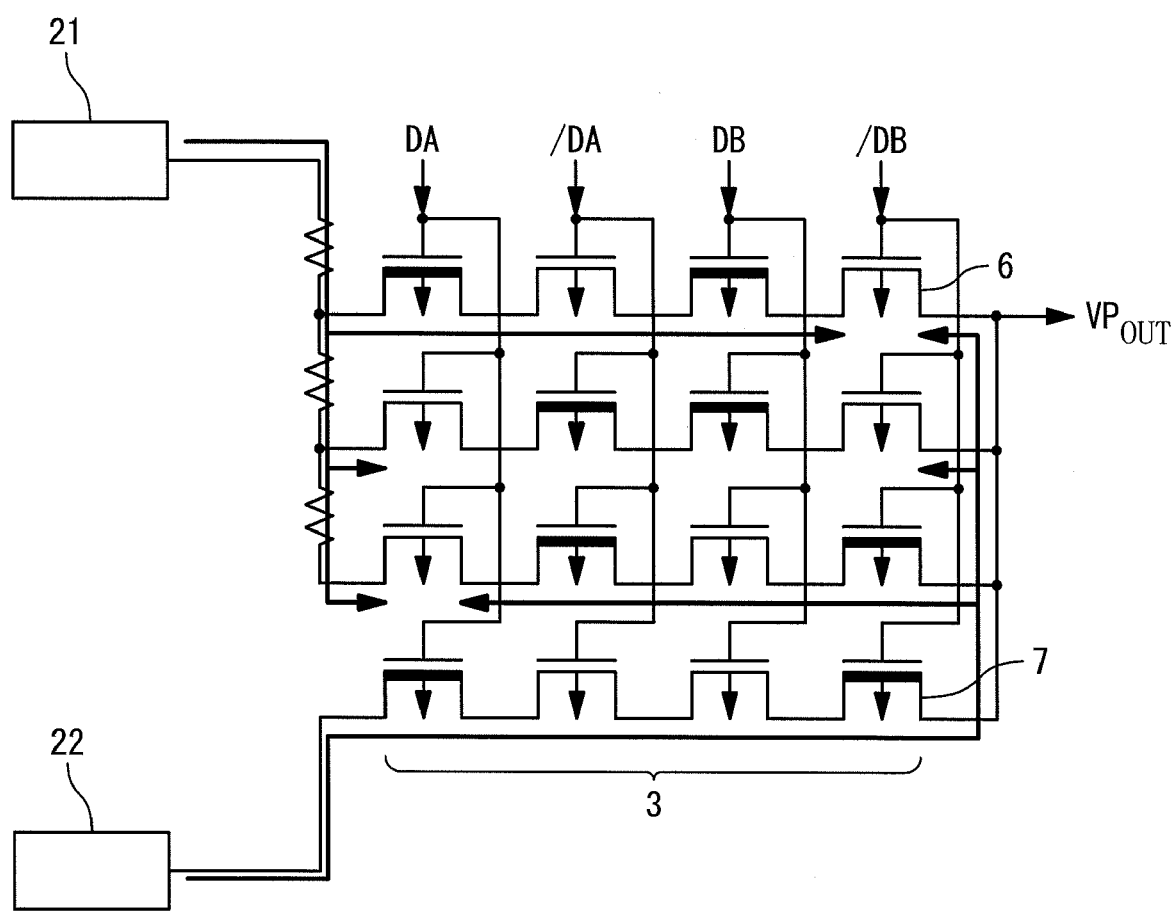
FIG. 5D is an equivalent circuit diagram schematically showing the semiconductor integrated circuit in the case of FIG. 4D.

At this time, as shown in FIG. 5D, all of the transistors in the series circuit inside the ROM decoder 3 linked to the wiring line D are turned on by the data signal to the ROM decoder 3. Thus, the second power source voltage of the power source 22 is supplied through the series circuit inside the ROM decoder 3 to the transistors inside the ROM decoder 3 linked to the wiring lines A to C. On the other hand, the first power source voltage of the power source 21 is supplied from the side of the wiring lines A to C, which is opposite to the wiring line D, to the transistors linked to the wiring lines A to C. Thus, the off transistors inside the ROM decoder 3 linked to the wiring lines A to C become in the state in which the different power source voltages such as the first and second power source voltages are applied between the sources and the drains. Hence, it is possible to measure the leakage current when the transistors linked to the wiring lines A to C are turned off.

Figure 6D:
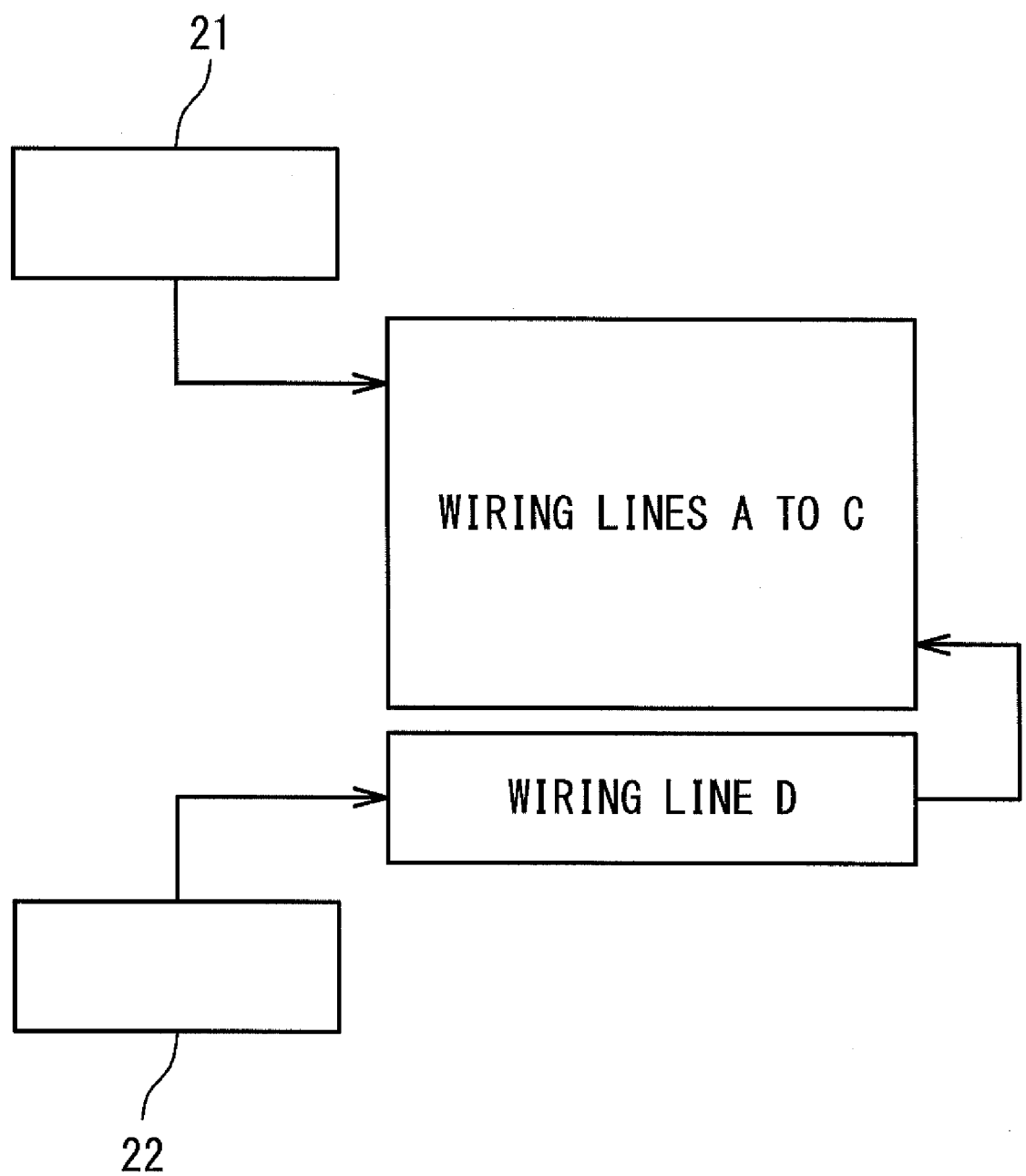
FIG. 6D is an equivalent circuit diagram showing a voltage state inside a ROM decoder in the case of FIG. 4D.

This is because the test circuit 5 is controlled such that the first power source voltage differing from the second power source voltage is applied to the transistors in the series circuits of linked to the wiring lines A to C, although the second power source voltage is applied to the transistors in the series circuit linked to the wiring line D, as shown in FIG. 6D.

With the above respective processes, the different voltages such as the first and second power source voltages can be applied to all the transistors in the series circuits (the rows of the ROM decoder 3) inside the ROM decoder 3.

Figure 1:
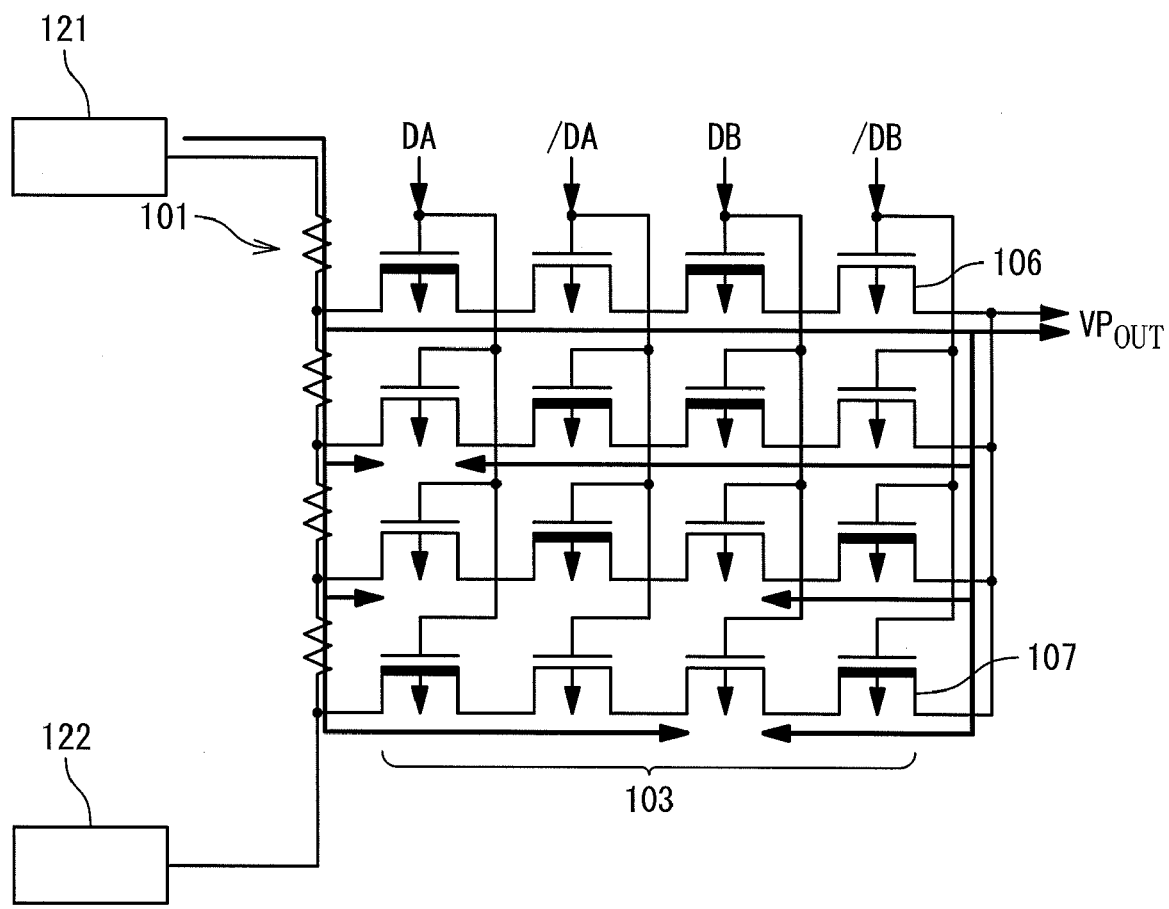
FIG. 1 is a schematic view showing a typical measuring method of a leakage current of a ROM decoder.
Figure 2:
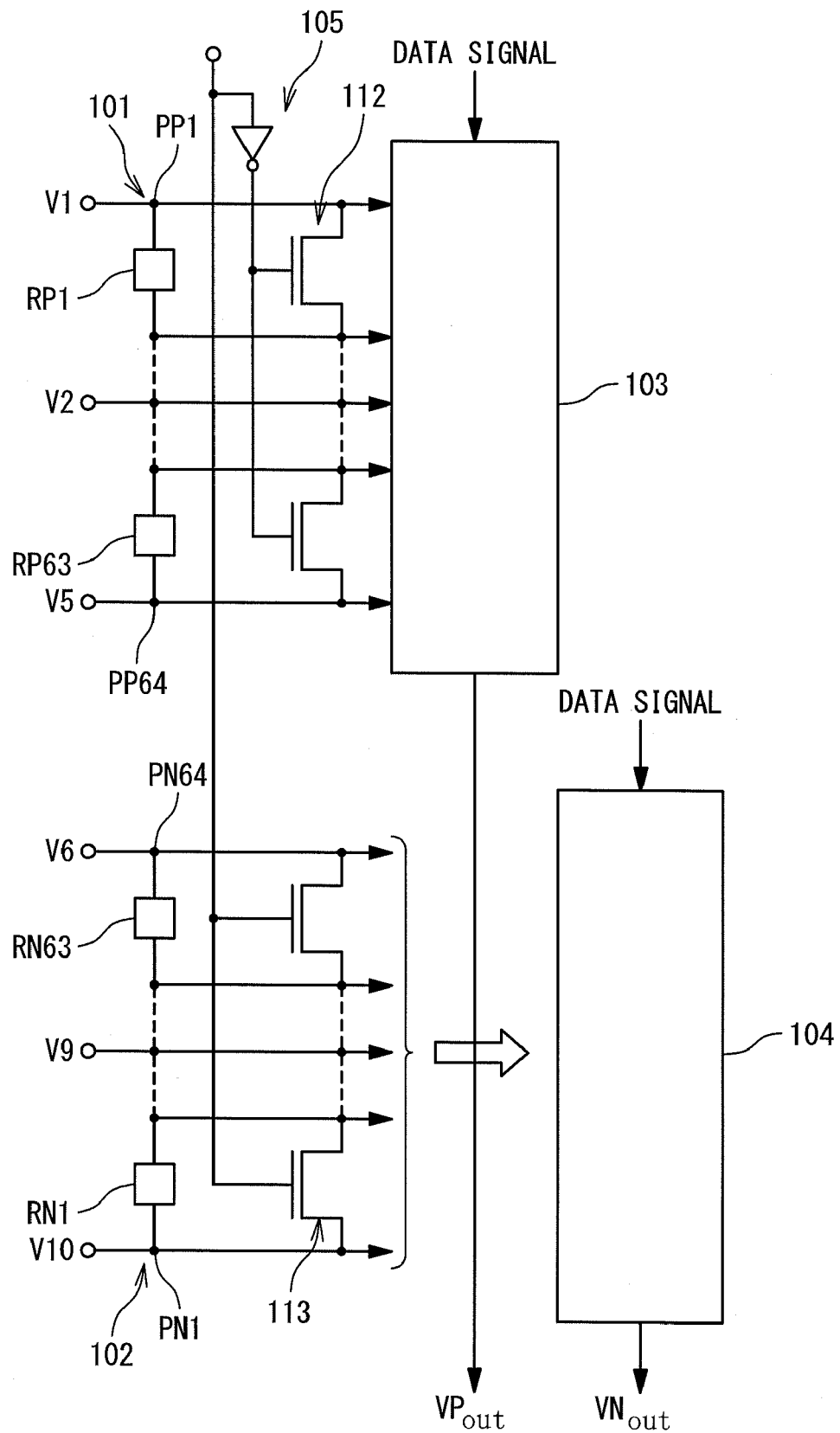
FIG. 2 is a schematic view showing a configuration of an integrated circuit apparatus in JP-A-Heisei 11-264855.

In the techniques described in FIGS. 1, 2, since the voltages from the respective power sources are applied to one ladder resistor, the source potential is always the same as the drain potential in the transistor inside the ROM decoder 3. Thus, it is impossible to measure the leakage current between the source and the drain when the transistor is turned off. However, in the present invention, the plurality of resistors configuring this one ladder resistor are separated into the two groups so that the different power source voltages can be applied to the two separated resistor groups, respectively. Thus, the leakage current between the source and the drain when the transistor inside the ROM decoder 3 is turned off can be measured although this could not be measured in the conventional technique.

Second Embodiment

A configuration of the semiconductor integrated circuit according to the second embodiment of the present invention will be described below. FIG. 7 is a circuit block diagram showing a configuration of the semiconductor integrated circuit according to the second embodiment of the present invention. The semiconductor integrated circuit 50 includes the ladder resistor 1, the ROM decoder 3 and the test circuit 5.

In this embodiment, the configuration of the test circuit 5 differs from that of the first embodiment. That is, the test circuit 5 supplies the different power source voltages through the ladder resistor 1 to the ROM decoder 3 and measures the leakage current of the ROM decoder 3. The test circuit 5 includes the plurality of separation switches SW_1 to SW_4, the plurality of power sources 21, 22, the controller 10 and a plurality of suppliers 15-1 to 15-4.

The plurality of separation switches SW_1 to SW_4 can separate the series connection of the ladder resistor 1 at the predetermined point based on control of the plurality of suppliers 15-1 to 15-4 controlled by the controller 10, when the leakage current is measured. That is, each of the plurality of separation switches SW_1 to SW_4 is the switch placed between adjacent two of the plurality of resistors RP in the ladder resistor 1, and is exemplified as the transistor. For example, each of the plurality of separation switches SW_1 to SW_4 is a PMOS transistor that is turned off by the High ("1") signal and turned on by the Low ("0") signal. The separation switch SW_1 is placed between the resistors RP1, RP2 and can separate the connection between the resistors RP1, RP2. The separation switch SW_2 is placed between the resistors RP2, RP3 and can separate the connection between the resistors RP2, RP3. The separation switch SW_3 is placed between the resistors RP3, RP4 and can separate the connection between the resistors RP3, RP4. The separation switch SW_4 is placed between the resistors RP3, RP4 and can separate the connection between the resistors RP3, RP4.

Incidentally, the separation switch SW_4 may not be used. In this case, an OR circuit may perform the logical sum of outputs to the separation switches SW_3, SW_4 from the suppliers 15-3, 15-4, and it may be supplied to the separation switch SW_3.

The power source 21 supplies a first power source voltage through a current meter (not shown) to the end of the series connection on the side of the resistor RP1, when the leakage current is measured. In addition, the first power source voltage is supplied to the connection point on the side of the resistor RP1 from the separating portion that separates the series connection and is one of the separation switches SW_1 to SW_4 by the plurality of suppliers 15-1 to 15-4. On the other hand, the power source 22 supplies a second power source voltage through a current meter (not shown) to the end of the series connection on the side of the resistor RP4, when the leakage current is measured. In addition, the second power source voltage is supplied to the connection point on the side of the resistor RP4 from the separating portion that separates the series connection and is one of the separation switches SW_1 to SW_4 by the suppliers 15-1 to 15-4. That is, the first and second power source voltages different from each other can be supplied to both sides of the separating portion that separates the series connection and is one of the separation switches SW_1 to SW_4. Incidentally, the external power source that is not included in the test circuit 5 may be used for the plurality of power sources 21, 22.

The plurality of suppliers 15-1 to 15-4 controls supplies of the first and second power source voltages to the ladder resistor 1, based on the control of the controller 10, when the leakage current is measured. That is, the plurality of suppliers 15-1 to 15-4 turns on/off the plurality of separation switches SW_1 to SW_4, respectively, based on the control signal of the controller 10, and supplies the first and second power source voltages to the predetermined portions of the ladder resistor 1, respectively.

Specifically, at first, the supplier 15-1 includes a first power source supply switch SW_11 and a second power source supply switch SW_21. The first power source supply switch SW_11 is connected to the middle of the wiring line through which the first power source voltage of the power source 21 is supplied between the resistor RP1 and the separation switch SW_1 and is turned on/off by the control signal of the controller 10. The second power source supply switch SW_21 is connected to the middle of the wiring line through which the second power source voltage of the power source 22 is supplied between the separation switch SW_1 and the resistor RP2 and is turned on/off by the control signal of the controller 10. Then, the supplier 15-1 transmits the control signal of the controller 10 in its original logical state (through the inverter× 2) to the separation switch SW_1 to control its on/off action. In addition, the supplier 15-1 logically inverts the control signal and then transmits (through the inverter×1) to the first power source supply switch SW_11 to control its on/off action. That is, the supplier 15-1 controls the supply of the first power source voltage. Moreover, the supplier 15-1 transmits the control signal in its original logical state to the second power source supply switch SW_21 to control its on/off action. That is, the supplier 15-1 controls the supply of the second power source voltage.

Similarly, the supplier 15-2 includes a first power source supply switch SW_12 and a second power source supply switch SW_22. The first power source supply switch SW_12 is connected to the middle of a wiring line through which the first power source voltage of the power source 21 is supplied between the resistor RP2 and the separation switch SW_2 and is turned on/off by the control signal of the controller 10. The second power source supply switch SW_22 is connected to the middle of the wiring line through which the second power source voltage of the power source 22 is supplied between the separation switch SW_2 and the resistor RP3 and is turned on/off by the control signal of the controller 10. Then, the supplier 15-2 transmits the control signal of the controller 10 in its original logical state (through the inverter×2) to the separation switch SW_2 to control its on/off action. In addition, the supplier 15-2 logically inverts the control signal and transmits (through the inverter×1) to the first power source supply switch SW_12 to control its on/off action. That is, the supplier 15-2 controls the supply of the first power source voltage. Moreover, the supplier 15-2 transmits the control signal in its original logical state to the second power source supply switch SW_22 to control its on/off action. That is, the supplier 15-2 controls the supply of the second power source voltage.

Similarly, the supplier 15-3 includes a first power source supply switch SW_13 and a second power source supply switch SW_23. The first power source supply switch SW_13 is connected to the middle of the wiring line through which the first power source voltage of the power source 21 is supplied between the resistor RP3 and the separation switch SW_3 and is turned on/off by the control signal of the controller 10. The second power source supply switch SW_23 is connected to the middle of the wiring line through which the second power source voltage of the power source 22 is supplied between the separation switch SW_3 and the resistor RP4 and is turned on/off by the control signal of the controller 10. Then, the supplier 15-3 transmits the control signal of the controller 10 in its original logical state (through the inverter× 2) to the separation switch SW_3 to control its on/off action. In addition, the supplier 15-3 logically inverts the control signal and transmits (through the inverter×1) to the first power source supply switch SW_13 to control its on/off action. That is, this controls the supply of the first power source voltage. Moreover, the supplier 15-3 transmits the control signal in its original logical state to the second power source supply switch SW_23 to control its on/off action. That is, the supplier 15-3 controls the supply of the second power source voltage.

Similarly, the supplier 15-4 includes a first power source supply switch SW_14 and a second power source supply switch SW_24. The first power source supply switch SW_14 is connected to the middle of the wiring line through which the first power source voltage of the power source 21 is supplied between the resistor RP4 and the separation switch SW_3 and is turned on/off by the control signal of the controller 10. The second power source supply switch SW_24 is connected to the middle of the wiring line through which the second power source voltage of the power source 22 is supplied between the separation switch SW_4 and the resistor RP4 and is turned on/off by the control signal of the controller 10. Then, the supplier 15-4 transmits the control signal of the controller 10 in its original logical state (through the inverter× 2) to the separation switch SW_4 to control its on/off action. In addition, the supplier 15-4 logically inverts the control signal and transmits (through the inverter×1) to the first power source supply switch SW_14 to control its on/off action. That is, the supplier 15-4 controls the supply of the first power source voltage. Moreover, the supplier 15-4 transmits the control signal in its original logical state to the second power source supply switch SW_24 to control its on/off action. That is, the supplier 15-4 controls the supply of the second power source voltage.

However, each of the first power source supply switches SW_11 to SW_14 is exemplified in, for example, a PMOS transistor that is turned off by the High ("1") signal and is turned on by the Low ("0") signal. Each of the second power source supply switches SW_21 to SW_24 is exemplified in, for example, an NMOS transistor that is turned on by the High ("1") signal and is turned off by the Low ("0") signal.

The controller 10 controls the suppliers 15-1 to 15-4 to control the separation in each of the plurality of separation switches SW_1 to SW_4 and the supplies of the first and second power source voltages to one and the other of the separated ladder resistor 1, when the leakage current is measured. That is, the controller 10 controls the suppliers 15-1 to 15-4 to set any one of the plurality of separation switches SW_1 to SW_4 to the separation state, and to set the others to the connection state. Then, the controller 10 controls the suppliers 15-1 to 15-4 to supply the first power source voltage to one side of the separating portion, and to supply the second power source voltage to the other side of the separating portion.

At the time except the measurement of the leakage current, the controller 10 controls the suppliers 15-1 to 15-4 for the sake of the original operation of the ladder resistor 1 to set all of the plurality of separation switches SW_1 to SW_4 to the connection state and to set the first power source supply switches SW_11 to SW_14 and the second power source supply switches SW_21 to SW_22 to the separation state.

Incidentally, since the ladder resistor 1 and the ROM decoder 3 are similar to those of the first embodiment, their descriptions are omitted.

An operation of the semiconductor integrated circuit according to the second embodiment of the present invention will be described below. FIGS. 8A to 8D are circuit block diagrams schematically showing the operation of the semiconductor integrated circuit according to the second embodiment of the present invention.

With reference to FIG. 7, all of the transistors in the series circuit inside the ROM decoder 3 linked to the wiring line A are turned on by the data signal to the ROM decoder 3 from the fore-stage circuit (not shown). Simultaneously, the controller 10 supplies the signal (1000) to the separation switches SW_1 to SW_4 correspondingly to the data signal. Thus, the PMOS transistor of the separation switch SW_1 is turned off and becomes in the separation state. On the other hand, the PMOS transistors of the separation switches SW_2 to SW_4 are turned on and become in the connection state.

Also, the PMOS transistor of the first power source supply switch SW_11 is turned on and becomes in the connection state. On the other hand, the PMOS transistors of the first power source supply switches SW_12 to SW_14 are turned off and become in the separation state. Moreover, the NMOS transistor in the second power source supply switches SW_21 is turned on and becomes in the connection state. On the other hand, the NMOS transistors in the second power source supply switches SW_22 to SW_24 are turned off and become in the separation state.

As a result, as shown in FIG. 8A, with respect to the separated separation switch SW_1, the first power source voltage is supplied to one side, and the second power source voltage is supplied to the other side. Specifically, the first power source voltage is supplied to one end of the ladder resistor 1 and between the resistor RP1 and the separation switch SW_1. On the other hand, the second power source voltage is supplied to the other end of the ladder resistor 1 and between the separation switch SW_1 and the resistor RP2.

Also in this case, similarly to the cases of FIG. 5A and FIG. 6A in the first embodiment, it is possible to measure the leakage current when the transistors linked to the wiring lines B to D are turned off. However, in this case, the supplies of the first power source voltage and the second power source voltage through the first power source supply switch SW_11 and the second power source supply switch SW_21 are carried out at the same time, as compared with the first embodiment. Thus, the values of the voltages supplied to the ROM decoder 3 become more constant. Hence, the leakage current can be measured more accurately.

Similarly, with reference to FIG. 7, all of the transistors in the series circuits inside the ROM decoder 3 linked to the wiring line B are turned on by the data signal to the ROM decoder 3 from the fore-stage circuit (not shown). Simultaneously, the controller 10 supplies the signal (0100) to the separation switches SW_1 to SW_4 correspondingly to the data signal. Thus, the PMOS transistor of the separation switch SW_2 is turned off and becomes in the separation state. On the other hand, the PMOS transistors of the separation switches SW_1, SW_3 and SW_4 are turned on and become in the connection state.

Also, the PMOS transistor of the first power source supply switch SW_12 is turned on and becomes in the connection state. On the other hand, the PMOS transistors of the first power source supply switches SW_11, SW_13 and SW_14 are turned off and become in the separation state. Moreover, the NMOS transistor in the second power source supply switches SW_22 is turned on and becomes in the connection state. On the other hand, the NMOS transistors in the second power source supply switches SW_21, SW_23 and SW_24 are turned off and become in the separation state.

As a result, as shown in FIG. 8B, with respect to the separated separation switch SW_2, the first power source voltage is supplied to one side, and the second power source voltage is supplied to the other side. Specifically, the first power source voltage is supplied to one end of the ladder resistor 1 and between the resistor RP2 and the separation switch SW_2. On the other hand, the second power source voltage is supplied to the other end of the ladder resistor 1 and between the separation switch SW_2 and the resistor RP3.

Also in this case, similarly to the cases of FIG. 5B and FIG. 6B in the first embodiment, it is possible to measure the leakage current when the transistors linked to the wiring lines C, D are turned off. However, in this case, the supplies of the first power source voltage and the second power source voltage through the first power source supply switch SW_12 and the second power source supply switch SW_22 are carried out at the same time, as compared with the first embodiment. Thus, the values of the voltages supplied to the ROM decoder 3 become more constant. Hence, the leakage current can be measured more accurately.

Similarly, with reference to FIG. 7, all of the transistors in the series circuit inside the ROM decoder 3 linked to the wiring line C are turned on by the data signal to the ROM decoder 3 from the fore-stage circuit (not shown). Simultaneously, the controller 10 supplies the signal (0010) to the separation switches SW_1 to SW_4 correspondingly to the data signal. Thus, the PMOS transistor of the separation switch SW_3 is turned off and becomes in the separation state. On the other hand, the PMOS transistors of the separation switches SW_1, SW_2 and SW_4 are turned on and become in the connection state.

Also, the PMOS transistor of the first power source supply switch SW_13 is turned on and becomes in the connection state. On the other hand, the PMOS transistors of the first power source supply switches SW_11, SW_12 and SW_14 are turned off and become in the separation state. Moreover, the NMOS transistor in the second power source supply switches SW_23 is turned on and becomes in the connection state. On the other hand, the NMOS transistors in the second power source supply switches SW_21, SW_22 and SW_24 are turned off and become in the separation state.

As a result, as shown in FIG. 8C, with respect to the separated separation switch SW_3, the first power source voltage is supplied to one side, and the second power source voltage is supplied to the other side. Specifically, the first power source voltage is supplied to one end of the ladder resistor 1 and between the resistor RP3 and the separation switch SW_3. On the other hand, the second power source voltage is supplied to the other end of the ladder resistor 1 and between the separation switch SW_3 and the resistor RP4.

Also in this case, similarly to the cases of FIG. 5C and FIG. 6C in the first embodiment, it is possible to measure the leakage current when the transistors linked to the wiring line D are turned off. However, in this case, the supplies of the first power source voltage and the second power source voltage through the first power source supply switch SW_13 and the second power source supply switch SW_23 are carried out at the same time, as compared with the first embodiment. Thus, the values of the voltages supplied to the ROM decoder 3 become more constant. Hence, the leakage current can be measured more accurately.

Similarly, with reference to FIG. 7, all of the transistors in the series circuit inside the ROM decoder 3 linked to the wiring D are turned on by the data signal to the ROM decoder 3 from the fore-stage circuit (not shown). Simultaneously, the controller 10 supplies the signal (0001) to the separation switches SW_1 to SW_4 correspondingly to the data signal. Thus, the PMOS transistor of the separation switch SW_4 is turned off and becomes in the separation state. On the other hand, the PMOS transistors of the separation switches SW_1 to SW_3 are turned on and become in the connection state.

Also, the PMOS transistor of the first power source supply switch SW_14 is turned on and becomes in the connection state. On the other hand, the PMOS transistors of the first power source supply switches SW_11 to SW_13 are turned off and become in the separation state. Moreover, the NMOS transistor in the second power source supply switches SW_24 is turned on and becomes in the connection state. On the other hand, the NMOS transistors in the second power source supply switches SW_21 to SW_23 are turned off and become in the separation state.

As a result, as shown in FIG. 8D, with respect to the separated separation switch SW_4, the first power source voltage is supplied to one side, and the second power source voltage is supplied to the other side. Specifically, the first power source voltage is supplied to one end of the ladder resistor 1 and between the separation switch SW_4 and the resistor RP3. On the other hand, the second power source voltage is supplied to the other end of the ladder resistor 1 and between the resistor RP4 and the separation switch SW_4.

Also in this case, similarly to the cases of FIG. 5D and FIG. 6D in the first embodiment, it is possible to measure the leakage current when the transistors linked to the wiring lines A to C are turned off. However, in this case, the supplies of the first power source voltage and the second power source voltage through the first power source supply switch SW_14 and the second power source supply switch SW_24 are carried out at the same time, as compared with the first embodiment. Thus, the values of the voltages supplied to the ROM decoder 3 become more constant. Hence, the leakage current can be measured more accurately.

With the above respective processes, the different voltages, such as the first power source voltage and the second power source voltage, can be applied to all of the transistors in the series circuits (the rows of the ROM decoder 3) inside the ROM decoder 3.

Even this embodiment can acquire the effects similar to those of the first embodiment. In addition to the supplies of the first and second power source voltages from both ends of the ladder resistor 1, at the same time, the first power source voltage can be supplied through one of the first power source supply switches SW_11 to SW_14, and the second power source voltage can be supplied through one of the second power source supply switches SW_21 to SW_24. Thus, the values of the voltages supplied to the ROM decoder 3 can be made more constant, and the leakage current can be measured more accurately.

Moreover, in the first embodiment, when the separation switch SW is in an off-state, one end of the ladder resistor 1 is disconnected from the circuit, and this may be considered to cause an occurrence of noise as a possibility. However, in this embodiment, one end of the separated ladder resistor 1 is connected to the power source 21 or the power source 22. Thus, this does not cause the occurrence of the noise. Hence, it is possible to largely suppress the possibility of the occurrence of an erroneous operation caused by the noise.

As mentioned above, according to the present invention, the leakage current between the source and the drain can be measured even when the transistor inside the ROM decoder is turned off. Thus, the quality improvement can be attained as the product of the semiconductor integrated circuit.

It is apparent that the present invention is not limited to the above embodiment, but may be modified and changed without departing from the scope and spirit of the invention. Also, the combination of the techniques of the respective embodiments can be applied unless the technical conflict occurs between them.

Although the present invention has been described above in connection with several exemplary embodiments thereof, it would be apparent to those skilled in the art that those exemplary embodiments are provided solely for illustrating the present invention, and should not be relied upon to construe the appended claims in a limiting sense.

What is claimed is:

1. A semiconductor integrated circuit comprising:
    a ladder resistor configured to include a plurality of resistors series-connected to each other and be supplied with a correction voltage at least one of both ends of said series connection and a plurality of connection points in said series connection to generate a plurality of gradation voltages at said plurality of connection points;
    a ROM decoder configured to select one of said plurality of gradation voltages generated by said ladder resistor, based on a supplied data signal; and
    a test circuit configured to measure a leakage current in said ROM decoder,
    wherein said test circuit includes:
    a plurality of separation units configured to separate said series connection, which is respectively supplied with different power source voltages at both ends, at a certain portion, when said leakage current is measured, and
    a control unit configured to control separation of said plurality of separation unit corresponding to said data signal.

2. The semiconductor integrated circuit according to claim 1, wherein said plurality of separation units is a plurality of switches provided between every adjacent two of said plurality of resistors.

3. The semiconductor integrated circuit according to claim 2, wherein said control unit controls one of said plurality of separation units to be in a separation state and the others of said plurality of separation units to be in a connection state, when said leakage current is measured.

4. The semiconductor integrated circuit according to claim 3, wherein said test circuit further includes:
    a plurality of suppliers configured to be provided correspondingly to said plurality of separation units, and control supply of said different power source voltages to resistors in said plurality of resistors connected to both sides of a separating portion that separates said series connection.

5. The semiconductor integrated circuit according to claim 4, wherein each of said plurality of suppliers includes:
    a first supply switch configured to be provided between a first power source as one of said different power source voltages and said separating portion, and
    a second supply switch configured to be provided between a second power source as the other of said different power source voltages,
    wherein said control unit controls said first supply switch and said second supply switch.

6. The semiconductor integrated circuit according to claim 5, wherein said ROM decoder includes:
    enhancement type transistors and depletion type transistors configured to be arranged in a matrix,
    wherein each row of said matrix includes:
    a transistor series circuit configured to be provided with a plurality of pairs, each pair being composed of two transistors, one being an enhancement type transistor and the other being a depletion type transistor that are adjacent to each other,
    wherein one end of said transistor series circuit is connected to corresponding one of said plurality of connection points of said ladder resistor, and
    the other end of said transistor series circuit is mutually connected to the other ends of the other transistor series circuits in the other rows to be connected to a post-stage circuit, wherein gates of enhancement type transistors and depletion type transistors included in each column of said matrix are mutually connected, and said data signal is supplied to gates of odd-numbered columns of said matrix, and an inversion signal of said data signal is supplied to gates of even-numbered columns of said matrix.

7. The semiconductor integrated circuit according to claim 1, wherein said control unit controls one of said plurality of separation units to be in a separation state and the others of said plurality of separation units to be in a connection state, when said leakage current is measured.

8. The semiconductor integrated circuit according to claim 7, wherein said test circuit further includes:
a plurality of suppliers configured to be provided correspondingly to said plurality of separation units, and control supply of said different power source voltages to resistors in said plurality of resistors connected to both sides of a separating portion that separates said series connection.

9. The semiconductor integrated circuit according to claim 8, wherein each of said plurality of suppliers includes:
a first supply switch configured to be provided between a first power source as one of said different power source voltages and said separating portion, and
a second supply switch configured to be provided between a second power source as the other of said different power source voltages,
wherein said control unit controls said first supply switch and said second supply switch.

10. The semiconductor integrated circuit according to claim 1, wherein said ROM decoder includes:
enhancement type transistors and depletion type transistors configured to be arranged in a matrix,
wherein each row of said matrix includes:
a transistor series circuit configured to be provided with a plurality of pairs, each pair being composed of two transistors, one being an enhancement type transistor and the other being a depletion type transistor that are adjacent to each other,
wherein one end of said transistor series circuit is connected to corresponding one of said plurality of connection points of said ladder resistor, and
the other end of said transistor series circuit is mutually connected to the other ends of the other transistor series circuits in the other rows to be connected to a post-stage circuit,
wherein gates of enhancement type transistors and depletion type transistors included in each column of said matrix are mutually connected, and
said data signal is supplied to gates of odd-numbered columns of said matrix, and an inversion signal of said data signal is supplied to gates of even-numbered columns of said matrix.

11. A method of testing a ROM decoder of a semiconductor integrated circuit, wherein said semiconductor integrated circuit includes:
a ladder resistor configured to include a plurality of resistors series-connected to each other and be supplied with a correction voltage at least one of both ends of said series connection and a plurality of connection points in said series connection to generate a plurality of gradation voltages at said plurality of connection points;
a ROM decoder configured to select one of said plurality of gradation voltages generated by said ladder resistor, based on a supplied data signal; and
a test circuit configured to measure a leakage current in said ROM decoder,
said method comprising:
supplying a data signal to said ROM decoder;
supplying different power source voltages at both ends of said series connection;
separating said series connection at a certain portion based on said data signal; and
measuring a leakage current of said ROM decoder.

* * * * *